United States Patent
Kuwahara et al.

(10) Patent No.: US 8,461,867 B2
(45) Date of Patent: Jun. 11, 2013

(54) SEMICONDUCTOR DEVICE HAVING PLURAL UNIT BUFFERS CONSTITUTING OUTPUT BUFFER

(75) Inventors: Shunji Kuwahara, Tokyo (JP); Hiroki Fujisawa, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 0 days.

(21) Appl. No.: 12/923,249

(22) Filed: Sep. 10, 2010

(65) Prior Publication Data

US 2011/0062984 A1 Mar. 17, 2011

(30) Foreign Application Priority Data

Sep. 11, 2009 (JP) ................................. 2009-210199

(51) Int. Cl.
*H03K 17/16* (2006.01)
*H01L 25/00* (2006.01)

(52) U.S. Cl.
USPC .................. 326/30; 326/41; 326/47; 326/101

(58) Field of Classification Search
USPC ............................ 326/82–87, 30, 37–47, 101
See application file for complete search history.

(56) References Cited

U.S. PATENT DOCUMENTS

| 4,888,498 | A | * | 12/1989 | Kadakia | 327/546 |
| 6,140,682 | A | * | 10/2000 | Liu et al. | 257/355 |
| 7,268,579 | B2 | * | 9/2007 | Park | 326/30 |
| 7,692,445 | B2 | * | 4/2010 | Muraoka et al. | 326/27 |
| 7,808,270 | B2 | * | 10/2010 | Fujisawa | 326/30 |
| 2005/0151563 | A1 | * | 7/2005 | Park | 326/30 |
| 2008/0054937 | A1 | * | 3/2008 | Kinoshita et al. | 326/30 |
| 2010/0007374 | A1 | * | 1/2010 | Chauhan et al. | 326/30 |
| 2011/0215830 | A1 | * | 9/2011 | Muraoka et al. | 326/30 |

FOREIGN PATENT DOCUMENTS

JP 2008-60679 3/2008

* cited by examiner

*Primary Examiner* — Thienvu Tran
(74) *Attorney, Agent, or Firm* — McGinn IP Law Group, PLLC

(57) ABSTRACT

To include an output terminal, unit buffers, and plural output-wiring paths that respectively connect the unit buffers and the output terminal. The output wiring paths have individual output wiring sections individually allocated to corresponding unit buffers. Unit buffers corresponding to these output wiring paths are common output wiring sections shared by the output wiring paths, and are connected to the output terminal without via a common output wiring section having a higher resistance value than those of the individual output wiring sections. Accordingly, an deviation of impedance due to a parasitic resistance between the output terminal and the unit buffers is suppressed.

17 Claims, 19 Drawing Sheets

SEMICONDUCTOR DEVICE HAVING PLURAL UNIT BUFFERS CONSTITUTING OUTPUT BUFFER

BACKGROUND OF THE INVENTION

1. Field of the Invention

The present invention relates to a semiconductor device, and more particularly relates to a semiconductor device including an output circuit capable of switching output impedances.

2. Description of Related Art

In a semiconductor device such as a DRAM (Dynamic Random Access Memory), impedances of an output circuit are required to be variable. Preparing plural output buffers having different impedances is considered to meet the requirement. However, in this case, a circuit scale of output circuits as a whole becomes very large, and a calibration circuit is necessary for each output buffer.

To solve the above problem, plural unit buffers each having the same impedance are prepared in advance, and the number of unit buffers to be used in parallel is selected according to an assigned impedance, instead of preparing plural output buffers having different impedances. According to this method, ideally, an output impedance can be set at X/i (i is an integer of 1 to n) by selecting one or more output buffers among n buffers in parallel, where X represents an impedance of one unit buffer (see Japanese Patent Application Laid-open No. 2008-60679 filed by the assignee of the present invention).

In a semiconductor device described in Japanese Patent Application Laid-open No. 2008-60679, impedances of unit buffers are collectively adjusted by a calibration circuit.

Specifically, a voltage at a calibration terminal and a reference voltage are compared with each other in case where an external resistor is connected to the calibration terminal, thereby adjusting an impedance of a replica buffer. Impedances of unit buffers can be collectively set by reflecting adjusted impedances of the replica buffer to each unit buffer.

Japanese Patent Application Laid-open No. 2008-60679 proposes a method of decreasing a deviation of impedance attributable to a parasitic resistance between a power source terminal and a unit buffer. A parasitic resistance is present between an output terminal and each unit buffer as well as between the power source terminal and each unit buffer. However, the parasitic resistance between the output terminal and each unit buffer is smaller than that between the power source terminal and each unit buffer, and thus conventionally it has not been a serious problem.

However, higher impedance precision has been required in recent years, and deviation of impedance attributable to a parasitic resistance between an output terminal and a unit buffer needs to be decreased. In this respect, employing the same method as that of Japanese Patent Application Laid-open No. 2008-60679 is not necessarily the best way, because a part of output wirings that connect an output terminal and a unit buffer is formed in a lower wiring layer where a resistance value is relatively high, while a major part of power source wirings is formed in a top low-resistance wiring layer.

SUMMARY

In one embodiment, there is provided a semiconductor device that includes an output terminal, a plurality of unit buffers and a plurality of output wiring paths that respectively connect the unit buffers and the output terminal. At least two of the output wiring paths have individual output wiring parts individually allocated to corresponding ones of the unit buffers. Unit buffers corresponding to the at least two output wiring paths are connected to the output terminal without via a common output wiring part, which is shared by the output wiring paths and has a higher resistance value than those of the individual output wiring parts.

According to the present invention, each unit buffer is connected to the output terminal via a substantially individual output-wiring path. Therefore, an impedance per one unit buffer makes a negligible change regardless of the selection number of a unit buffer. Accordingly, deviation of impedance due to a parasitic resistance between an output terminal and a unit buffer is decreased. As a result, a semiconductor device including an output circuit having high impedance precision can be provided.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
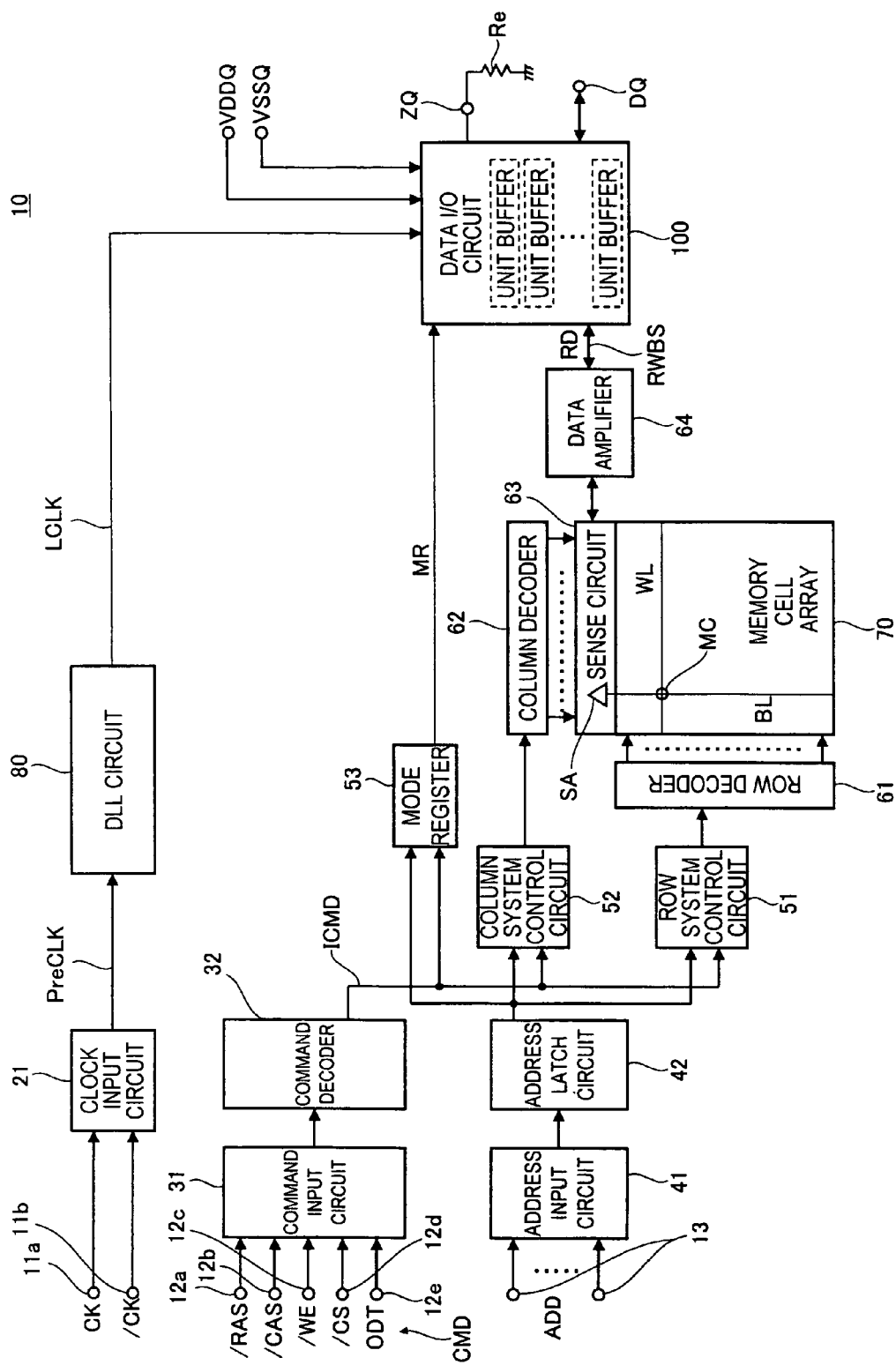
FIG. 1 is a block diagram showing an overall configuration of a semiconductor device according to a preferred embodiment of the present invention.

FIG. 1 is a block diagram showing an overall configuration of a semiconductor device 10 according to a preferred embodiment of the present invention.

The semiconductor device 10 according to the present embodiment is a DDR SDRAM, and includes, as external terminals, clock terminals 11a and 11b, command terminals 12a to 12e, an address terminal 13, a data input/output (I/O) terminal (an output terminal) DQ, a calibration terminal ZQ, and power source terminals VDDQ and VSSQ. Although the semiconductor device 10 also includes a data strobe signal, a reset terminal or the like, these terminals are not shown in FIG. 1.

The clock terminals 11a and 11b are supplied with external clock signals CK and /CK, respectively. The supplied external clock signals CK and /CK are supplied to a clock input circuit 21. In the present specification, a signal having "/" at the head of a signal name means an inversion signal of a corresponding signal or a low active signal. Therefore, the external clock signals CK and /CK are mutually complementary signals. The clock input circuit 21 generates an internal clock signal PreCLK of a single phase based on the external clock signals CK and /CK, and supplies this internal clock signal PreCLK to a DLL circuit 80. The DLL circuit 80 generates a phase-controlled internal clock LCLK, and supplies the internal clock LCLK to a data I/O circuit 100.

The command terminals 12a to 12e are supplied with a row-address strobe signal /RAS, a column-address strobe signal /CAS, a write enable signal /WE, a chip select signal /CS, and an on-die termination signal ODT, respectively. These command signals CMD are supplied to a command input circuit 31. The command signals CMD are supplied to a command decoder 32 from the command input circuit 31. The command decoder 32 holds, decodes, and counts command signals, thereby generating various internal commands ICMD. The internal commands ICMD are supplied to a row-system control circuit 51, a column-system control circuit 52, and a mode register 53.

The address terminal 13 is supplied with an address signal ADD. The address signal ADD supplied to this terminal is next supplied to an address input circuit 41. An output of the address input circuit 41 is supplied to an address latch circuit 42. Out of the address signal ADD latched by the address latch circuit 42, a row address is supplied to the row-system control circuit 51, and a column address is supplied to the column-system control circuit 52. When entered in a mode register set, the address signal ADD is supplied to the mode register 53, thereby updating the content of the mode register 53.

An output of the row-system control circuit 51 is supplied to a row decoder 61. The row decoder 61 selects any one word line WL included in a memory cell array 70. In the memory cell array 70, plural word lines WL are intersected with plural bit lines BL, and memory cells MC are arranged at their intersections (FIG. 1 shows only one word line WL, one bit line BL, and one memory cell MC). The bit lines BL are connected to corresponding sense amplifiers SA in a sense circuit 63.

An output of the column-system control circuit 52 is supplied to a column decoder 62. The column decoder 62 selects any one sense amplifier SA included in the sense circuit 63. A sense amplifier SA selected is connected to a data amplifier 64. In a read operation, the data amplifier 64 amplifies read data RD once amplified by the sense amplifier SA, and supplies the amplified read data RD to the data I/O circuit 100 via a read/write bus RWBS. On the other hand, in a write operation, the data amplifier 64 amplifies write data supplied from the data I/O circuit 100 via the read/write bus RWBS, and supplies the amplified write data to the sense amplifier SA.

The data I/O terminal DQ is connected to the data I/O circuit 100, and outputs read data and inputs write data. The data I/O circuit 100 includes plural unit buffers 111 to 11n as shown in FIG. 1. The data I/O circuit 100 is also connected to the calibration terminal ZQ. When the internal command ICMD instructs a calibration operation, the data I/O circuit 100 performs a calibration operation based on an external resistor Re connected to the calibration terminal ZQ. An impedance code obtained by the calibration operation is set common to the unit buffers 111 to 11n, details of which are described later.

Although FIG. 1 shows only one data I/O terminal DQ, the data I/O terminal DQ does not need to be one, and plural data I/O terminals DQ can be provided. When plural data I/O terminals DQ are provided, the data I/O circuit 100 needs to be provided by the same number as that of the data I/O terminals DQ.

Figure 2:
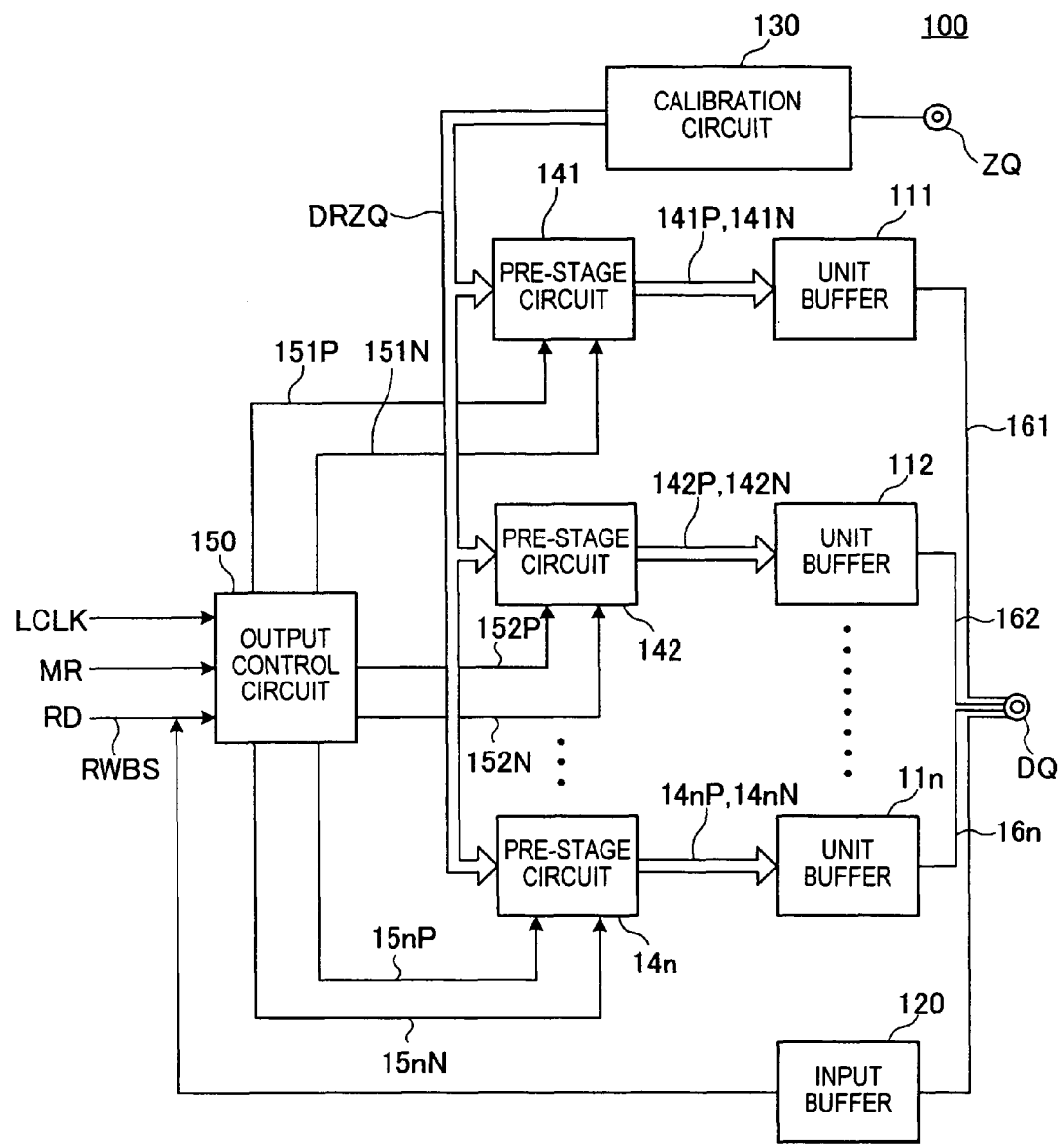
FIG. 2 is a block diagram showing a configuration of the data I/O circuit according to a first embodiment of the present invention.

FIG. 2 is a block diagram showing a configuration of the data I/O circuit 100 according to a first embodiment of the present invention.

As shown in FIG. 2, the data I/O circuit 100 includes n unit buffers 111 to 11n and an input buffer 120 each connected to the data I/O terminal DQ, and a calibration circuit 130 connected to the calibration terminal ZQ. While the input buffer 120 is activated at data inputting, details of a circuit configuration and a data input operation are not directly relevant to the scope of the present invention, and therefore are not explained in the present specification.

The unit buffers 111 to 11n use the data I/O terminal DQ at data reading, and they are connected in parallel to the data I/O terminal DQ as shown in FIG. 2. Therefore, when an impedance of one unit buffer is X, an output impedance can be X/i (i is a natural number equal to or smaller than n as a total number of unit buffers). As shown in FIG. 2, in the first embodiment, the unit buffers 111 to 11n are independently connected to the data I/O terminal DQ via individual output wiring parts 161 to 16n, respectively. This is very important point of the embodiment and the detail is described later.

In the first embodiment, pre-stage circuits 141 to 14n are provided at pre-stages of the n unit buffers 111 to 11n, respectively. The pre-stage circuits 141 to 14n assign output transistors (described later) to be turned ON included in corresponding unit buffers 111 to 11n. Turning ON/OFF of these output transistors is selected by ON signals 141P to 14nP and ON signals 141N to 14nN. As shown in FIG. 2, an impedance code DRZQ is supplied in common to the pre-stage circuits 141 to 14n from the calibration circuit 130, and ON signals 151P to 15nP and ON signals 151N to 15nN are individually supplied to the pre-stage circuits 141 to 14n from an output control circuit 150.

The output control circuit 150 specifies a unit buffer to be activated out of the unit buffers 111 to 11n, and specifies an output logic level of a unit buffer to be activated. An output logic level of a unit buffer to be activated is determined based on read data RD supplied via the read/write bus RWBS. The ON signals 151P to 15nP and 151N to 15nN are output synchronously with the internal clock LCLK supplied from the DLL circuit 80.

Circuit blocks constituting the data I/O circuit 100 are explained in further detail.

Figure 3:
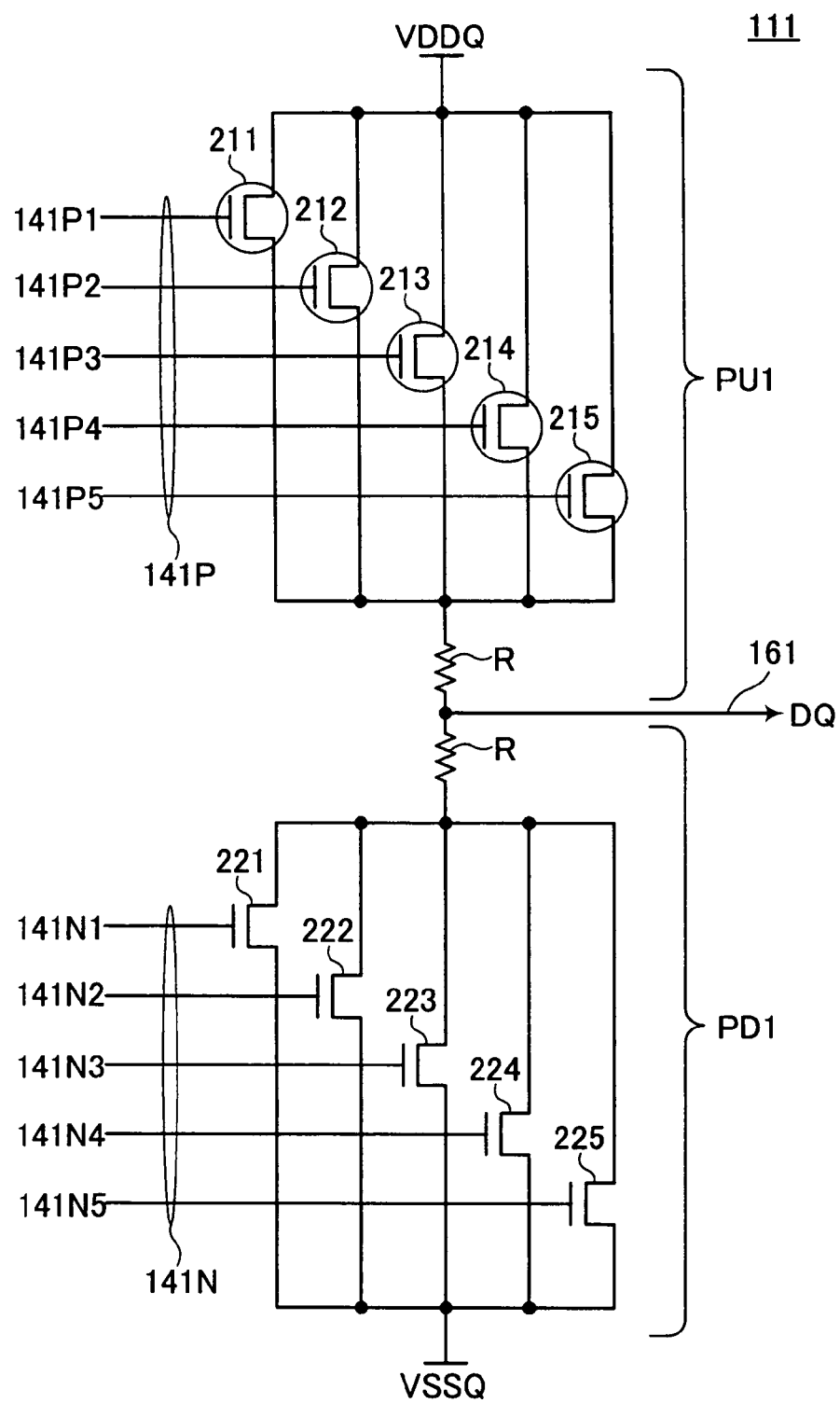
FIG. 3 is a circuit diagram of the unit buffer.

FIG. 3 is a circuit diagram of the unit buffer 111.

As shown in FIG. 3, the unit buffer 111 includes: plural (five in this embodiment) P-channel MOS transistors (output transistors) 211 to 215 connected in parallel between the power source terminal VDDQ and the data I/O terminal DQ;

plural (five in this embodiment) N-channel MOS transistors (output transistors) 221 to 225 connected in parallel between the power source terminal VSSQ and the data I/O terminal DQ; and two resistors R connected in series between the output transistors 211 to 215 and the output transistors 221 to 225. A connection point between the two resistors R is connected to the data I/O terminal DQ via the individual output wiring unit 161. Out of the unit buffer 111, a part including the P-channel MOS transistors 211 to 215 and the resistor R constitute a pull-up circuit PU1, and a part including the N-channel MOS transistors 221 to 225 and the resistor R constitute a pull-down circuit PD1.

Five operation signals 141P1 to 141P5 that constitute the ON signal 141P are supplied to gates of the output transistors 211 to 215, respectively. Five operation signals 141N1 to 141N5 that constitute the ON signal 141N are supplied to gates of the output transistors 221 to 225, respectively. Accordingly, ten output transistors included in the unit buffer 111 are individually ON/OFF controlled by ten operation signals 141P1 to 141P5 and 141N1 to 141N5, respectively.

The pull-up circuit PU1 and the pull-down circuit PD1 are designed to become at a predetermined impedance $r_{mos}$ (120Ω, for example) in conductive state. However, ON resistances of output transistors vary depending on manufacturing conditions, and vary depending on environmental temperatures and power source voltages during an operation. Therefore, a desired impedance is not necessarily obtained. Consequently, to obtain an actual impedance as a desired value, the number of output transistors to be turned ON needs to be adjusted. For this purpose, parallel circuits including plural output transistors are used.

To adjust finely and broadly an impedance of the unit buffer 111, it is preferable to mutually differentiate W/L ratios (a ratio of a gate width to a gate length) of plural output transistors constituting the pull-up circuit PU1 and the pull-down circuit PD1, respectively. It is particularly preferable to add a weight of a power of two to this ratio. For example, when a W/L ratio of the output transistor 211 is "1WLp", it is preferable to set W/L ratios of the output transistors 212 to 215 at "2WLp", "4WLp", "8WLp", and "16WLp", respectively. Similarly, when a W/L ratio of the output transistor 221 is "1WLn", it is preferable to set W/L ratios of the output transistors 222 to 225 at "2WLn", "4WLn", "8WLn", and "16WLn", respectively.

Resistance values of the resistors R are designed at substantially the same value as an ON resistance $r_{mos}$ of parallel transistors, such as 120Ω. Therefore, when at least one of the pull-up circuit PU1 and the pull-down circuit PD1 is in an ON state, an impedance of the unit buffer 111 from a viewpoint of the data I/O terminal DQ becomes 240Ω (=120Ω+120Ω). A high resistance wiring made in a diffusion layer or, made of tungsten (W), titanium nitride (TiN) or the like can be used for the resistors R.

Other unit buffers 112 to 11n also have the same circuit configurations as that of the unit buffer 111 shown in FIG. 3, except that the operation signals 142P to 14nP and the operation signals 142N to 14nN are input to these unit buffers, respectively.

Figure 4:
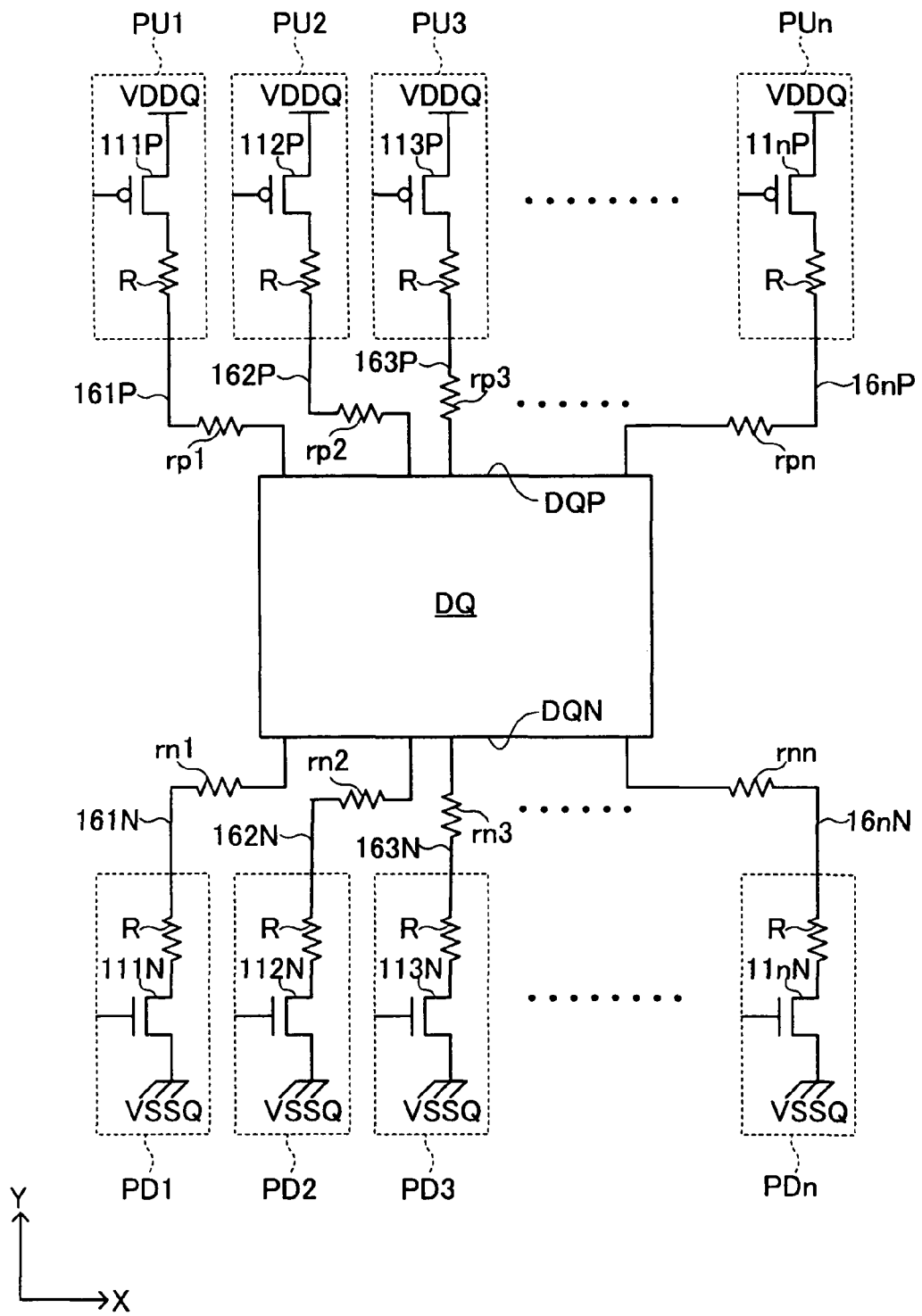
FIG. 4 is a schematic layout diagram showing a positional relationship between the unit buffers and the data I/O terminal.
Figure 5:
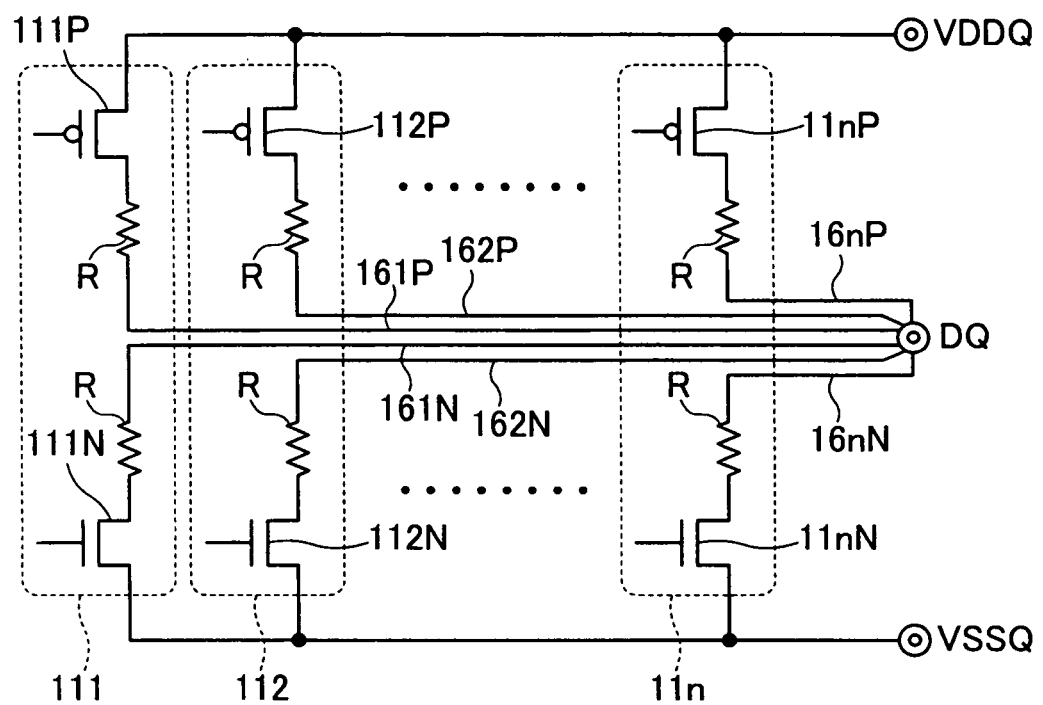
FIG. 5 is a circuit diagram showing a connection relationship between the unit buffers and the data I/O terminal.

FIG. 4 is a schematic layout diagram showing a positional relationship between the unit buffers 111 to 11n and the data I/O terminal DQ. FIG. 5 is a circuit diagram showing a connection relationship between the unit buffers 111 to 11n and the data I/O terminal DQ.

In FIGS. 4 and 5, parallel transistors included in the unit buffers 111 to 11n are expressed equivalently as one transistor. For example, the transistor 111P shown in FIGS. 4 and 5 corresponds to the transistors 211 to 215 included in the unit buffer 111, and the transistor 111N shown in FIGS. 4 and 5 corresponds to the transistors 221 to 225 included in the unit buffer 111. Similarly, the transistors 112P and 112N correspond to two parallel circuits constituting the unit buffer 112, respectively, and the transistors 11nP and 11nN correspond to two parallel circuits constituting the unit buffer 11n, respectively. This similarly applies to FIG. 14 described later.

In a layout shown in FIG. 4, pull-up circuits PU1 to PUn included in the unit buffers 111 to 11n are arranged at an upper side in a Y direction in view of the data I/O terminal DQ, and pull-down circuits PD1 to PDn included in the unit buffers 111 to 11n are arranged at a lower side in the Y direction in view of the data I/O terminal DQ. The pull-up circuits PU1 to PUn are arranged in an X direction, and are connected to one side DQP of the data I/O terminal DQ via individual output wiring parts 161P to 16nP, respectively. Similarly, the pull-down circuits PD1 to PDn are arranged in the X direction, and are connected to the other side DQN of the data I/O terminal DQ via individual output wiring parts 161N to 16nN, respectively.

As shown in FIGS. 4 and 5, in the first embodiment, the pull-up circuits PU1 to PUn and the pull-down circuits PD1 to PDn are connected to the data I/O terminal DQ via the individual output wiring parts 161P to 16nP and 161N to 16nN, respectively. That is, output wiring paths that connect the unit buffers 111 to 11n and the data I/O terminal DQ include only the individual output wiring parts 161P to 16nP and 161N to 16nN allocated to the corresponding unit buffers 111 to 11n, respectively, and do not have a common output wiring part shared by the output wiring paths.

As a result, an impedance per one unit buffer becomes constant regardless of the number of the unit buffers 111 to 11n activated, assuming that a difference between parasitic resistances rp1 to rpn among the individual output wiring parts 161P to 16nP and a difference between parasitic resistances rn1 to rnn among the individual output wiring parts 161N to 16nN can be disregarded. That is, when an impedance of one unit buffer is X, an output impedance can be set substantially completely at X/i (i is a natural number equal to or smaller than n as a total number of unit buffers). However, it is not essential that the parasitic resistances rp1 to rpn or the parasitic resistances rn1 to rnn are completely same. There can be a slight difference in a resistance value depending on a difference in a wiring length. A difference in a parasitic resistance in each output wiring path is very small, and the difference can be minimized at a value smaller than 1Ω (about 0.5Ω) by arranging the unit buffers 111 to 11n very close to the data I/O terminal DQ like the layout shown in FIG. 4.

On the other hand, when a difference in a parasitic resistance in each output wiring path cannot be disregarded, a difference in a parasitic resistance can be offset by adjusting a resistance value of the resistor R included in each of the unit buffers 111 to 11n. That is, it suffices that a resistance value of each resistor R is designed such that a sum of a resistance value of each resistor R and a parasitic resistance value of a corresponding output wiring path becomes equal.

Figure 6:
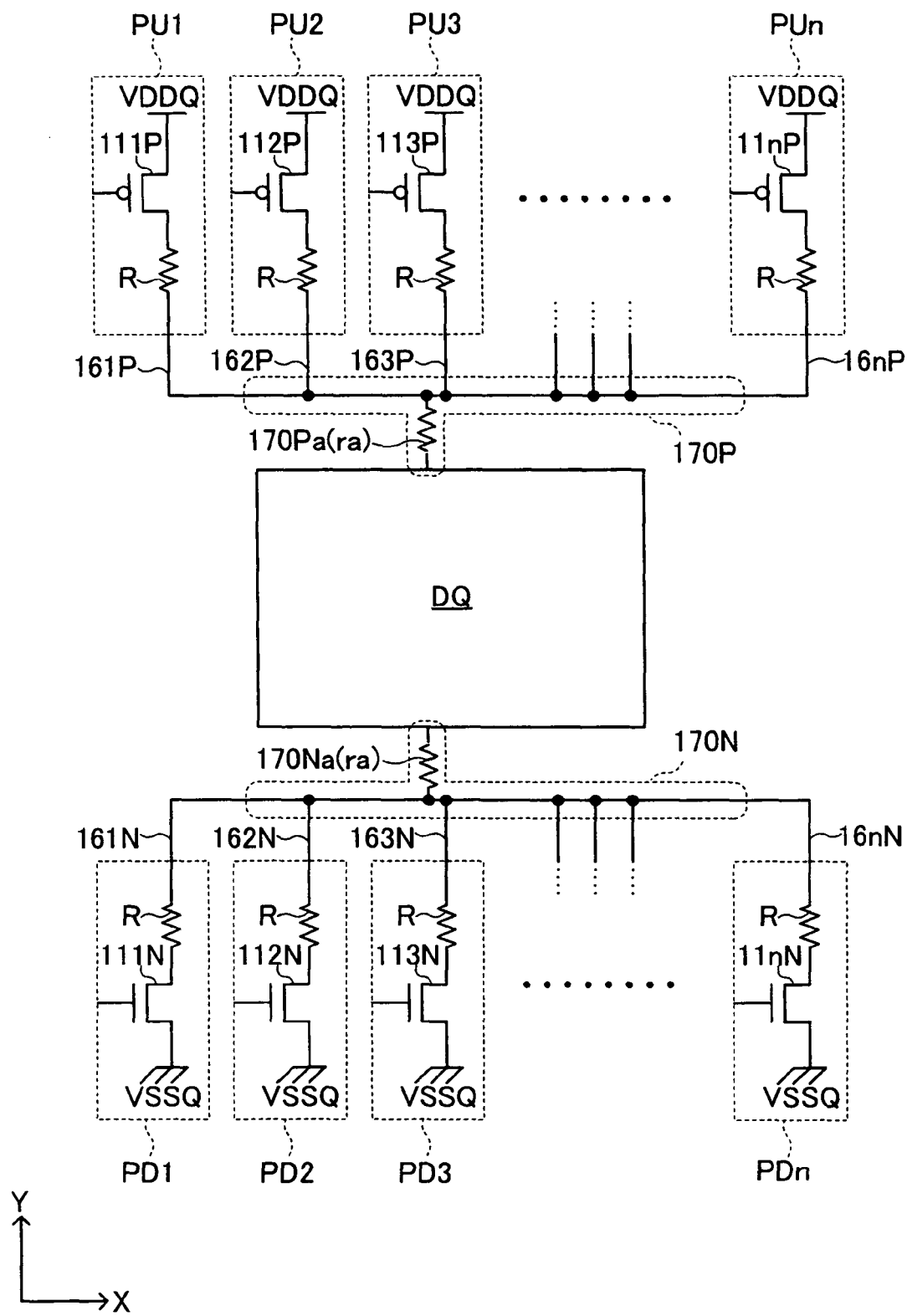
FIG. 6 is a schematic layout diagram showing a positional relationship between the unit buffers and the data I/O terminal according to a comparative example.
Figure 7:
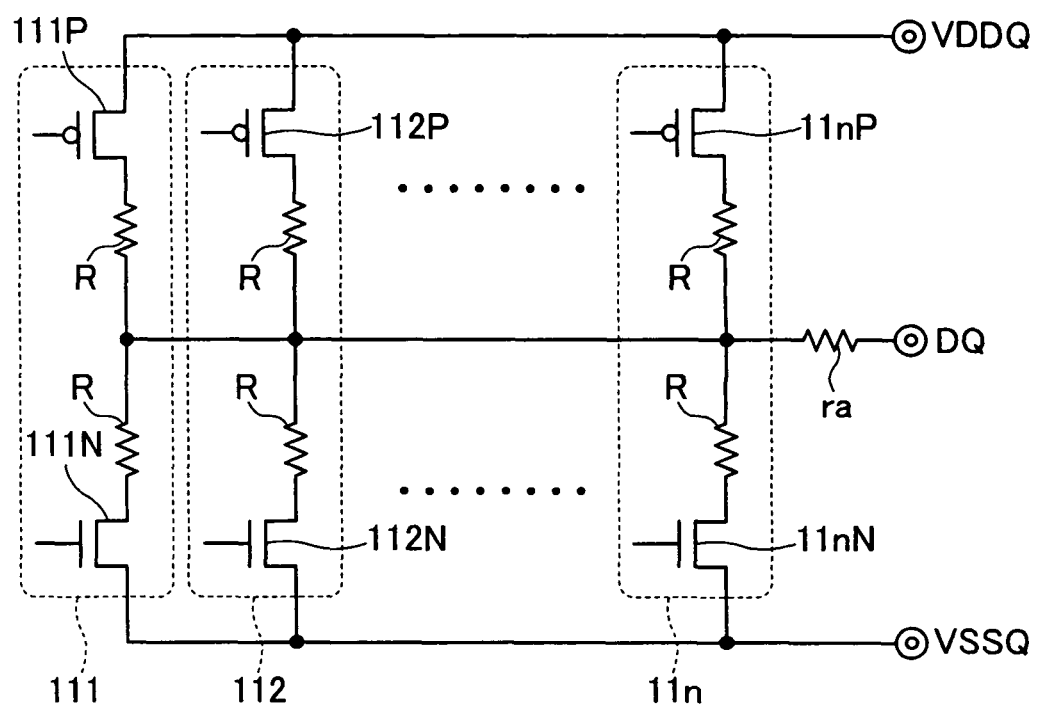
FIG. 7 is a circuit diagram showing a connection relationship between the unit buffers and the data I/O terminal according to the comparative example.

FIG. 6 is a schematic layout diagram showing a positional relationship between the unit buffers 111 to 11n and the data I/O terminal DQ according to a comparative example. FIG. 7 is a circuit diagram showing a connection relationship between the unit buffers 111 to 11n and the data I/O terminal DQ according to the comparative example.

In the comparative example shown in FIGS. 6 and 7, main parts of output wiring paths connecting the pull-up circuits PU1 to PUn and the data I/O terminal DQ and connecting the pull-down circuits PD1 to PDn and the data I/O terminal DQ share common output wiring parts 170P and 170N, respectively. In this configuration, deviation of an impedance generated by the common output wiring parts 170P and 170N becomes large when the number of the unit buffers 111 to 11n used increases.

This is explained by mentioning specific values. When a parasitic resistance ra of a part 170Pa shared by all the pull-up circuits PU1 to PUn is 2Ω and when parasitic resistances of other parts are disregarded out of the common output wiring part 170P, a total impedance corresponding to the number of pull-up circuits PU to be turned ON becomes as shown in Table 1. As shown in Table 1, an impedance per one pull-up circuit PU is set as 238Ω because an impedance of a single pull-up circuit PU is 240Ω−2Ω=238Ω as a result of performing a calibration operation such that an impedance becomes 240Ω including the parasitic resistance ra (=2Ω).

TABLE 1

| Number of activation | Ideal value | Actual value | Error rate |
|---|---|---|---|
| 1 | 240 Ω | 240 Ω | 0.0% |
| 2 | 120 Ω | 121 Ω | 0.8% |
| 3 | 80 Ω | 81 Ω | 1.7% |
| 4 | 60 Ω | 62 Ω | 2.5% |
| 5 | 48 Ω | 50 Ω | 3.3% |
| 6 | 40 Ω | 42 Ω | 4.2% |
| 7 | 34 Ω | 36 Ω | 5.9% |

As shown in Table 1, in the comparative example in FIGS. 6 and 7, deviation of an impedance (an impedance error) becomes larger when the number of pull-up circuits PU to be turned ON increases. This is because the parasitic resistance ra (2Ω) of the common output wiring part 170Pa is superimposed on all output wiring paths because pull-up circuits PU to be turned ON are all connected to the data I/O terminal DQ via the common output wiring part 170Pa. This is similarly applied to the pull-down circuit PD, and the parasitic resistance ra (20) of the common output wiring part 170Na is superimposed on all output wiring paths.

On the other hand, according to the first embodiment explained with reference to FIGS. 4 and 5, an error like that in the above comparative example does not occur because the unit buffers 111 to 11n are connected to the data I/O terminal DQ without via a common output wiring part. That is, an impedance as a design value shown in Table 1 can be obtained.

Circuit configurations and operations of the calibration circuit 130 and the pre-stage circuits 141 to 14n included in the data I/O circuit 100 are explained below.

Figure 8:
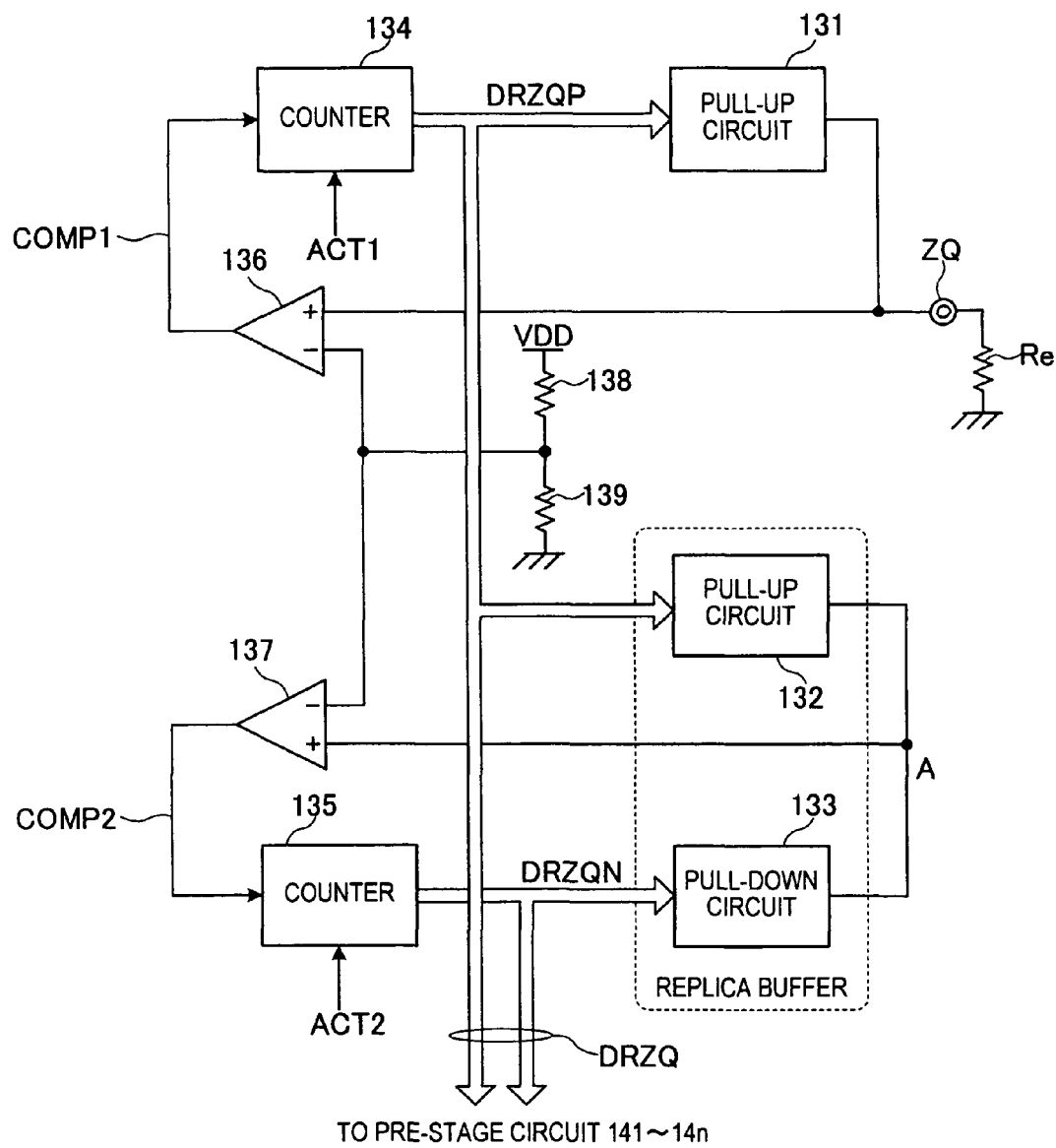
FIG. 8 is a circuit diagram of the calibration circuit.

FIG. 8 is a circuit diagram of the calibration circuit 130.

As shown in FIG. 8, the calibration circuit 130 includes pull-up circuits 131 and 132, a pull-down circuit 133, a counter 134 that controls operations of the pull-up circuits 131 and 132, a counter 135 that controls the pull-down circuit 133, a comparator 136 that controls the counter 134, and a comparator 137 that controls the counter 135.

Figure 9:
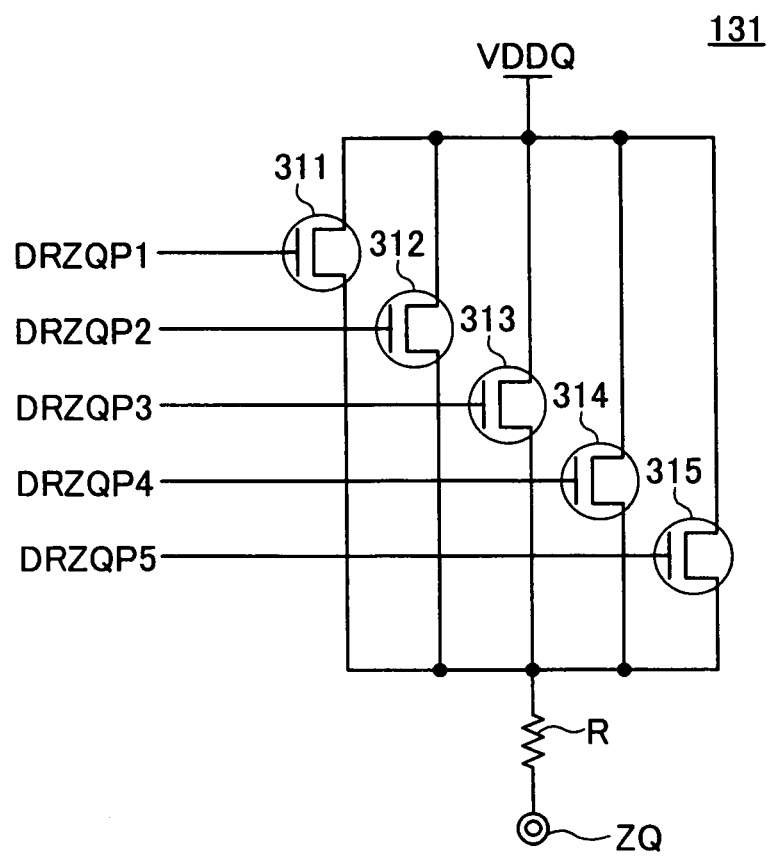
FIG. 9 is a circuit diagram of the pull-up circuit.

FIG. 9 is a circuit diagram of the pull-up circuit 131.

As shown in FIG. 9, the pull-up circuit 131 has substantially the same circuit configuration as those of the pull-up circuits PU included in the unit buffers 111 to 11n. That is, the pull-up circuit 131 includes five P-channel MOS transistors 311 to 315 connected in parallel to the power source terminal VDDQ, and the resistor R of which one end is connected to drains of the P-channel MOS transistors 311 to 315, and the other end is connected to the calibration terminal ZQ.

The transistors 311 to 315 included in the pull-up circuit 131 correspond to the output transistors 211 to 215 shown in FIG. 3, respectively, and have the same impedances respectively. Therefore, W/L ratios of the transistors 311 to 315 are set at "1WLp", "2WLp", "4WLp", "8WLp", and "16WLp", respectively which are the same as the W/L ratios of the transistors 211 to 215, respectively. However, so far as impedances are substantially the same, sizes of the transistors 311 to 315 included in the pull-up circuit 131 and sizes of the output transistors 211 to 215 shown in FIG. 3 do not need to be all the same, and shrunk transistors can be used.

The resistor R also corresponds to the resistors R shown in FIG. 3, and therefore, a resistance value of this resistor R is designed at substantially the same value as that of the ON resistance $r_{mos}$ of parallel transistors 311 to 315, for example, at 120Ω.

Impedance cords DRZQP1 to DRZQP5 are supplied to gates of the transistors 311 to 315, respectively from the counter 134, thereby controlling the pull-up circuit 131. The impedance cords DRZQP1 to DRZQP5 correspond to the ON signals 141P1 to 141P5, respectively.

The pull-up circuit 132 has also the same circuit configuration as that of the pull-up circuit 131 shown in FIG. 9, except that the other end of a resistor R1 is connected to a ground A. Therefore, the impedance cords DRZQP1 to DRZQP5 are supplied to gates of five transistors included in the pull-up circuit 132.

Figure 10:
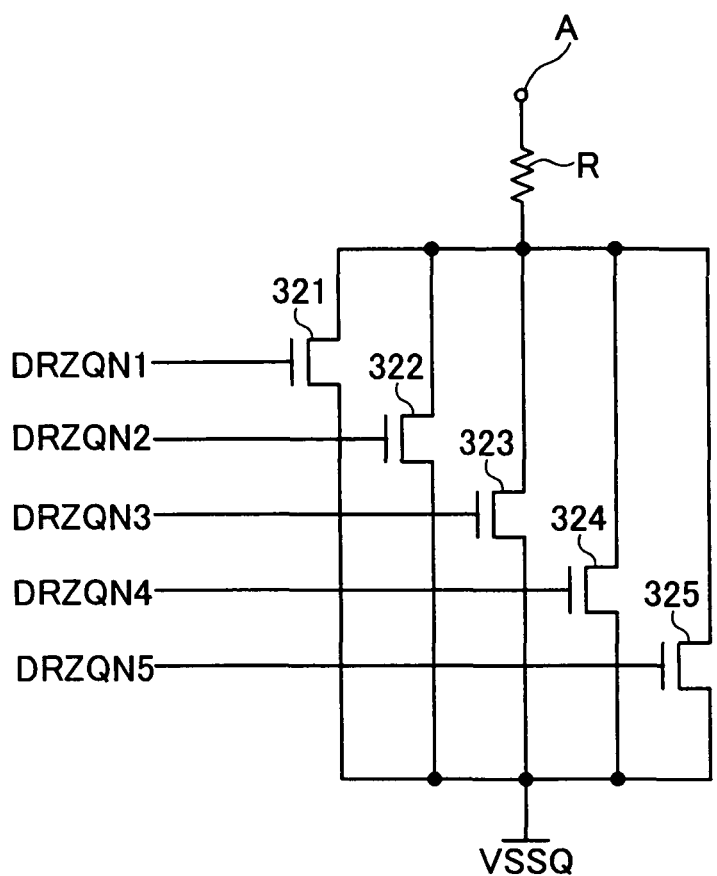
FIG. 10 is a circuit diagram of the pull-down circuit.

FIG. 10 is a circuit diagram of the pull-down circuit 133.

As shown in FIG. 10, the pull-down circuit 13 has substantially the same circuit configuration as those of the pull-down circuits D included in the unit buffers 111 to 11n. That is, the pull-down circuit 133 includes five N-channel MOS transistors 321 to 325 connected in parallel to the power source terminal VSSQ, and the resistor R of which one end is connected to drains of these transistors. The transistors 321 to 325 included in the pull-down circuit 133 correspond to the transistors 221 to 225 shown in FIG. 3, and have the same impedances, respectively. This point is similar to that of the pull-up circuit 131. The resistor R also corresponds to the resistor R shown in FIG. 3, and therefore, a resistance value of the resistor R is designed at substantially the same value as that of the ON resistance $r_{mos}$ of the transistors 321 to 325 connected in parallel, for example, at 120Ω.

Impedance cords DRZQN1 to DRZQN5 are supplied to gates of the transistors 321 to 325, respectively from the counter 135, thereby controlling the pull-down circuit 133. The impedance cords DRZQN1 to DRZQN5 correspond to the ON signals 161N1 to 161N5, respectively.

As explained above, the pull-up circuits 131 and 132 have substantially the same circuit configurations as those of the pull-up circuits PU included in the unit buffers 111 to 11n, and the pull-down circuit 133 has substantially the same circuit configuration as those of the pull-down circuits PD included in the unit buffers 111 to 11n. Therefore, impedances of the pull-up circuits 131 and 132 and the pull-down circuit 133 are adjusted at 240Ω, for example.

As shown in FIG. 8, the pull-up circuit 132 and the pull-down circuit 133 constitute a "replica buffer" having substantially the same circuit configuration as that of the unit buffer 111. The "substantially the same" in this case means that a circuit configuration is regarded the same even when a transistor included in the replica buffer is shrunk. A contact A as an output terminal of the replica buffer is connected to a non-inverting input terminal (+) of the comparator 137 as shown in FIG. 8.

The counter 134 counts up or counts down when a control signal ACT1 is activated. The counter 134 continues count up when a comparison signal COMP1 as an output of the comparator 136 is at a high level, and continues count down when the comparison signal COMP1 is at a low level. A non-inverting input terminal (+) of the comparator 136 is connected to the calibration terminal ZQ, and an inverting input terminal (−) is connected to an intermediate point between resistors 138 and 139 which connect a power source potential (VDD) and a ground potential (GND). The comparator 136 compares a potential of the calibration terminal ZQ with an intermediate voltage (VDD/2), based on this configuration. When the potential of the calibration terminal ZQ is higher, the comparison signal COMP1 as an output is set at a high level. When the intermediate voltage (VDD/2) is higher, the comparator 136 sets the comparison signal COMP1 at a low level.

On the other hand, the counter 135 counts up or counts down when the control signal ACT2 is activated. The counter 135 continues count up when a comparison signal COMP2 as an output of the comparator 137 is at a high level, and continues count down when the comparison signal COMP2 is at a low level. A non-inverting input terminal (+) of the comparator 137 is connected to the contact A as an output end of the replica buffer, and an inverting input terminal (−) is connected to the intermediate point between the resistors 138 and 139. The comparator 137 compares an output potential of the replica buffer with the intermediate voltage (VDD/2), based on this configuration. When the output potential of the replica buffer is higher, the comparison signal COMP2 as an output is set at a high level. When the intermediate voltage (VDD/2) is higher, the comparator 137 sets the comparison signal COMP2 at a low level.

The counters 134 and 135 stop counting when the control signals ACT1 and ACT2 are inactivated, and hold a current count value. As described above, a count value of the counter 134 is used as the impedance cord DRZQP, and a count value of the counter 135 is used as the impedance cord DRZQN. The impedance cord DRZQ as a collective term of the impedance cords is supplied in common to the pre-stage circuits 141 to 14$n$ shown in FIG. 2.

Figure 11:
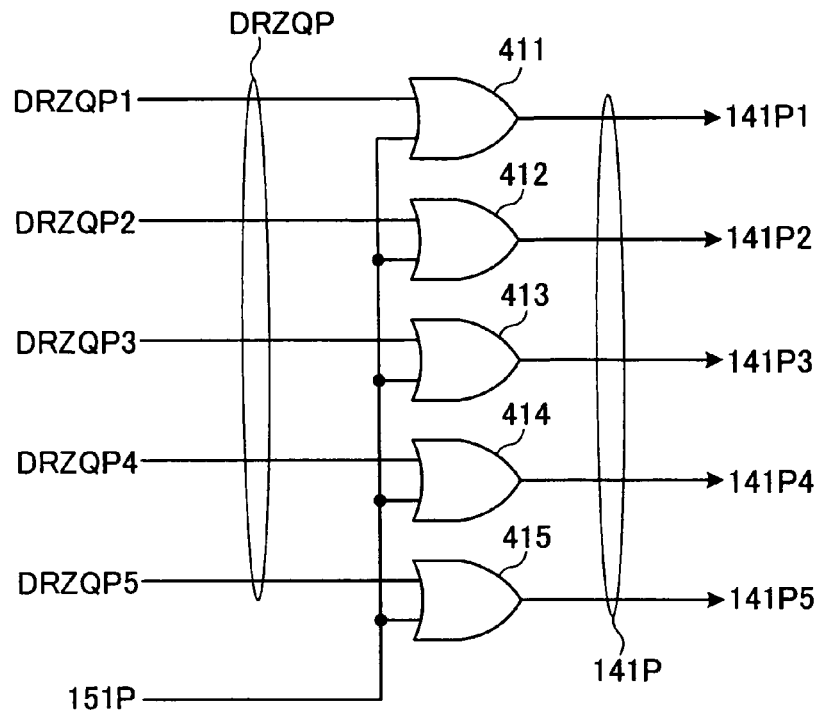
FIG. 11 is a circuit diagram of the pre-stage circuit.
Figure 11:
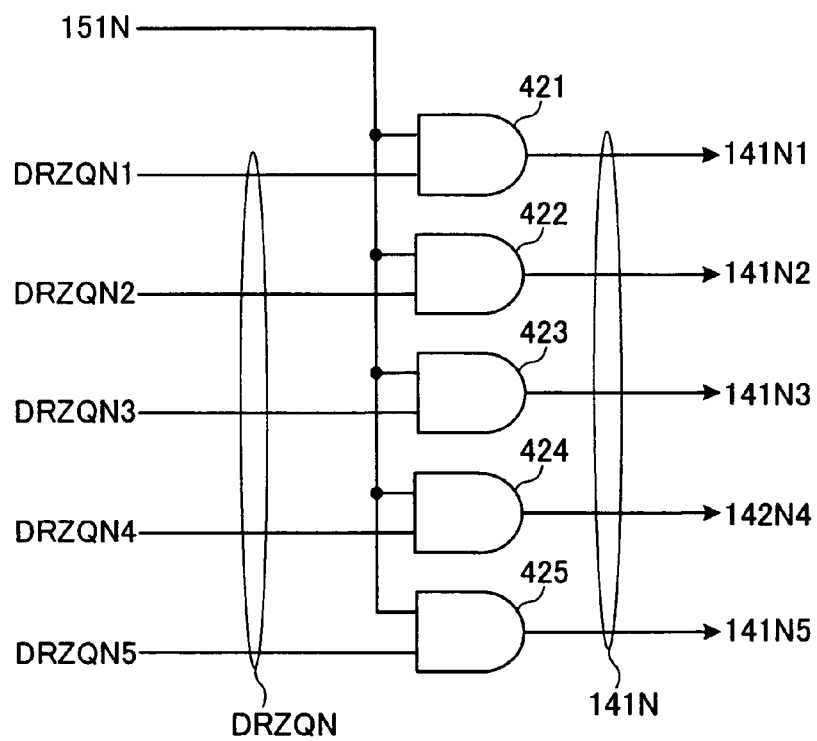

FIG. 11 is a circuit diagram of the pre-stage circuit 141.

As shown in FIG. 11, the pre-stage circuit 141 is configured by five OR circuits 411 to 415, and five AND circuits 421 to 425. The OR circuits 411 to 415 are supplied with the selection signal 151P in common from the output control circuit 150, and are also supplied with impedance cords DRZQP1 to DRZQP5, respectively from the calibration circuit 130. On the other hand, the AND circuits 421 to 425 are supplied with the selection signal 151N in common from the output control circuit 150, and are also supplied with impedance cords DRZQN1 to DRZQN5, respectively from the calibration circuit 130.

The ON signals 141P1 to 141P5 (constituting the ON signal 141P) as outputs of the OR circuits 411 to 415, and ON signals 141N1 to 141N5 (constituting the ON signal 141N) as outputs of the AND circuits 421 to 425 are supplied to the unit buffer 111 as shown in FIG. 3, and control corresponding transistors.

Other pre-stage circuits 142 to 14$n$ also have circuit configurations similar to that of the pre-stage circuit 141 shown in FIG. 11. As shown in FIG. 2, OR circuits and AND circuits included in the pre-stage circuits 142 to 14$n$ are supplied with selection signals 152P and 152N to 15$n$P and 15$n$N, respectively from the output control circuit 150.

As shown in FIG. 2, the output control circuit 150 is supplied with read data RD. The output control circuit 150 sets the selections signals 151P and 151N to 15$n$P and 15$n$N at a predetermined logic level based on a logic level of the read data RD.

Specifically, when the read data RD is at a high level, the selection signals 151P and 151N to 15$n$P and 15$n$N corresponding to the unit buffers 111 to 11$n$ to be operated are set at a low level. Accordingly, the pull-up circuit PU included in a corresponding unit buffer is turned ON, and a high-level signal is output from the data I/O terminal DQ. On the other hand, when the read data RD is at a low level, the selection signals 151P and 151N to 15$n$P and 15$n$N corresponding to the unit buffers 111 to 11$n$ to be operated are set at a high level. Accordingly, the pull-down circuit PD included in a corresponding unit buffer is turned ON, and therefore, a low-level signal is output from the data I/O terminal DQ.

In the unit buffers 111 to 11$n$ not operated at outputting, the corresponding selection signals 151P to 15$n$P are set at a high level, and the corresponding selection signals 151N to 15$n$N are set at a low level. Accordingly, the pull-up circuit PU and the pull-down circuit PD included in a corresponding unit buffer are turned OFF, and therefore, the corresponding unit buffer becomes in a high impedance state.

When an ODT (On Die Termination) function using the unit buffers 111 to 11$n$ as terminating resisters is used, the selection signals 151P to 15$n$P corresponding to the unit buffers 111 to 11$n$ to be operated are set at a low level, and the selection signals 151N to 151$n$N for the buffers are set at a high level. Accordingly, the pull-up circuit PU and the pull-down circuit PD included in a corresponding unit buffer are turned ON, and therefore, the unit buffers 111 to 11$n$ function as terminating resistors.

Which unit buffers are to be operated is designated by a mode signal MR from the mode register 53 shown in FIG. 1. When an output impedance designated by the mode signal MR is 240Ω/i, the output control circuit 150 activates i unit buffers out of the unit buffers 111 to 11$n$, and inactivates the rest unit buffers.

As explained above, in the first embodiment, the unit buffers 111 to 11$n$ are connected to the data I/O terminal DQ without via a common output wiring part. Therefore, when an impedance of one unit buffer is X, an output impedance can be substantially completely at X/i (i is a natural number equal to or smaller than n as a total number of unit buffers).

Although no common output wiring part is present between the unit buffers 111 to 11$n$ and the data I/O terminal DQ in the first embodiment, the present invention is not limited thereto. Even when a common output wiring part shared by two or more unit buffers is present in an output wiring path that connects many unit buffers and the data I/O terminal DQ, deviation of an impedance derived from the common output wiring part can be sufficiently suppressed when a parasitic resistance of the common output wiring part is sufficiently lower than resistance values of individual output wiring parts individually connected to corresponding unit buffers.

Figure 12:
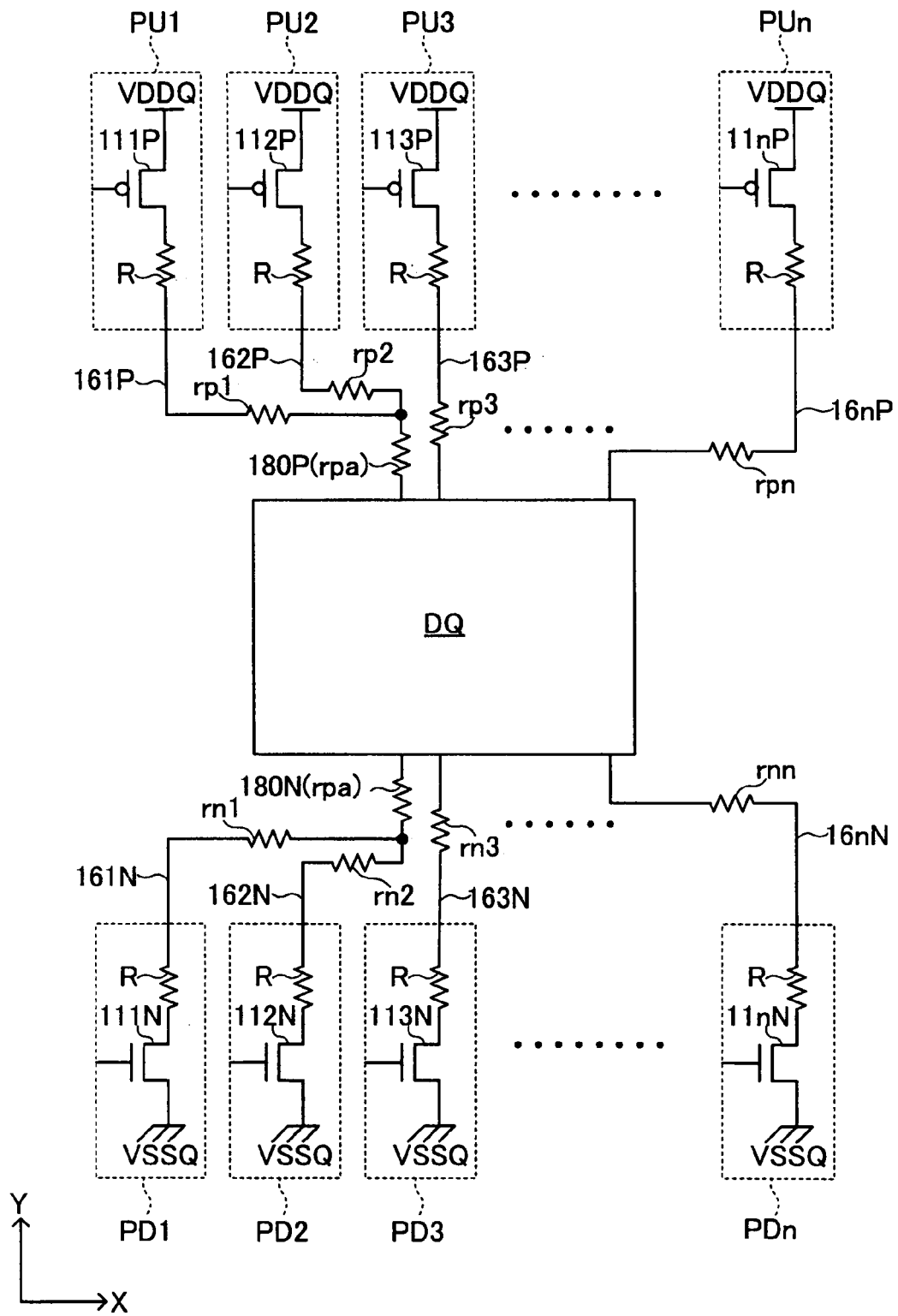
FIG. 12 is a schematic layout diagram according to one variation of the present invention.

FIG. 12 is an example that pull-up circuits PU1 and PU2 are connected to the data I/O terminal DQ via a common output wiring part 180P, and pull-down circuits PD1 and PD2 are connected to the data I/O terminal DQ via a common output wiring part 180N. Even when plural pull-up circuits and pull-down circuits are connected to the data I/O terminal DQ via the common output wiring parts 180P and 180N in this way, deviation of an impedance based on the common output wiring parts 180P and 180N can be suppressed when parasitic resistances rpa and rna of the common output wiring parts 180P and 180N are lower than the rest parasitic resistances, that is, when the parasitic resistances rpa and rna are lower than parasitic resistances rp1, rp2, rn1, and rn2 of individual output wiring parts 161P, 162P, 161N, and 162N individually connected to corresponding pull-up circuits and pull-down circuits. The example shown in FIG. 12 is suitable for application when plural output wirings extended to a Y direction need to be shared because of a shortage of wiring tracks in the Y direction.

Figure 13:
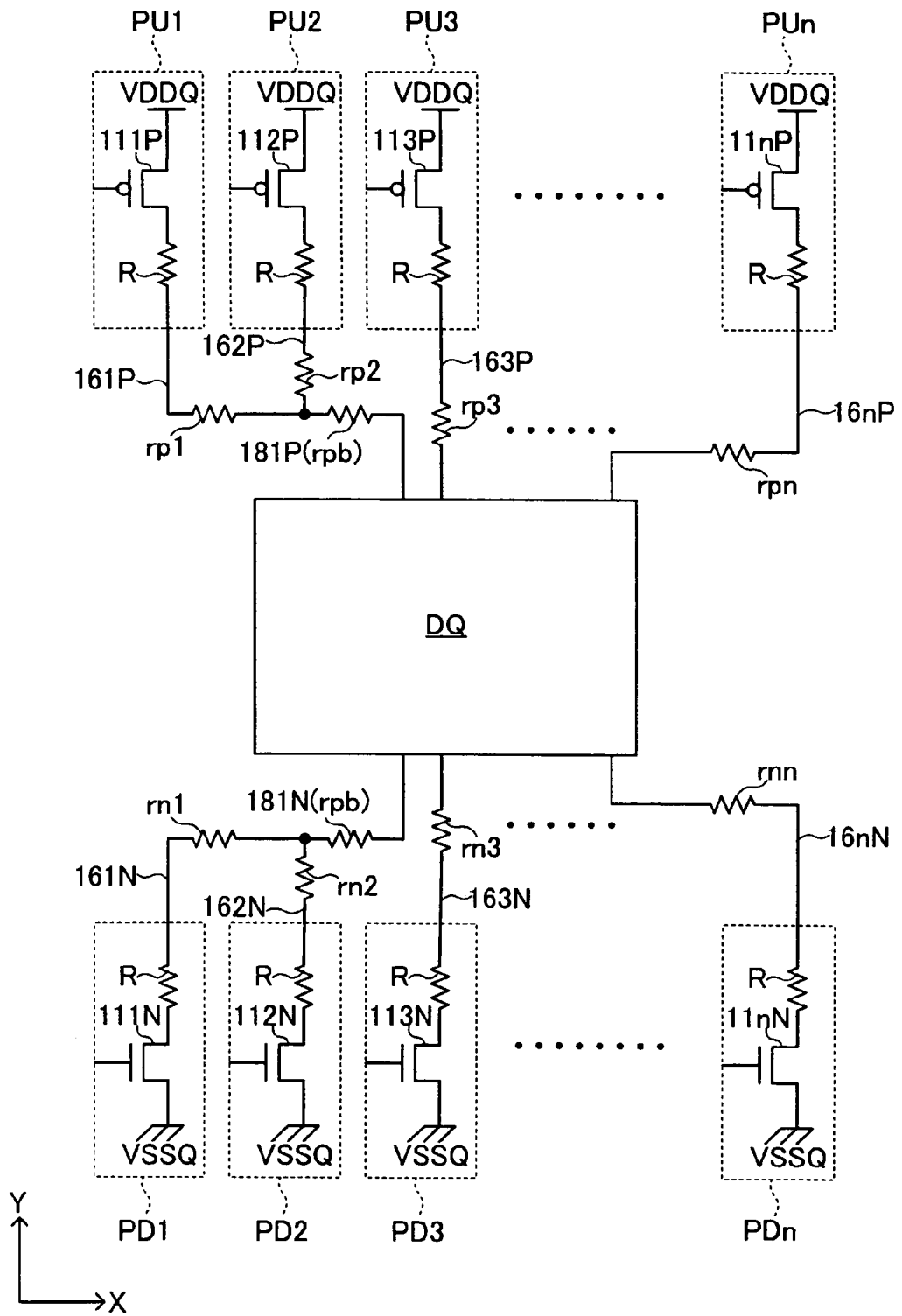
FIG. 13 is a schematic layout diagram according to another variation of the present invention.

FIG. 13 is an example suitable for application when a part of plural output wiring paths extended to a Y direction needs to be shared because of a shortage of wiring tracks in the Y direction. In this example, the pull-up circuits PU1 and PU2 are connected to the data I/O terminal DQ via a common output wiring part 181P, and the pull-down circuits PD1 and PD2 are connected to the data I/O terminal DQ via a common output wiring part 181N. In this case, deviation of an impedance generated by the common output wiring parts 181P and 181N can be suppressed when parasitic resistances rpb and rnb of the common output wiring parts 181P and 181N are lower than the rest resistance values, that is, when the parasitic resistances rpb and rnb are lower than the parasitic resistances rp1, rp2, rn1, and rn2 of the individual output wiring parts 161P, 162P, 161N, and 162N individually connected to corresponding pull-up circuits and pull-down circuits.

As explained with reference to FIGS. 12 and 13, deviation of an impedance generated when apart of the pull-up circuits and pull-down circuits is connected to the data I/O terminal DQ via a common output wiring part can be decreased by selecting appropriately unit buffers by the output control circuit 150. That is, like in the examples shown in FIGS. 12 and 13, when the unit buffers 111 and 112 are connected to the data I/O terminal DQ via a common output wiring part, the above-described deviation-of-impedance occurs when two unit buffers 111 and 112 are selected simultaneously. Taking this point into consideration, when the unit buffers 111 to 11$n$ need to be simultaneously activated, it is preferable to select a unit buffer to be activated from the unit buffers 113 to 11$n$ without activating the unit buffer 112 and the unit buffer 111 simultaneously. That is, even when plural unit buffers are connected in common to the data I/O terminal DQ via a common output wiring part, deviation of impedance (impedance error) does not occur when only one of the unit buffers is activated. Therefore, a unit buffer is selected by the output control circuit 150 to secure this condition as far as possible.

A second embodiment of the present invention is explained next.

In the second embodiment of the present invention, deviation of impedance attributable to a parasitic resistance between the power source terminals VDDQ and VSSQ and the unit buffers 111 to 11$n$ are offset. Other features of the second embodiment are identical to those of the first embodiment, and the second embodiment can achieve effects identical to those of the first embodiment.

Figure 14:
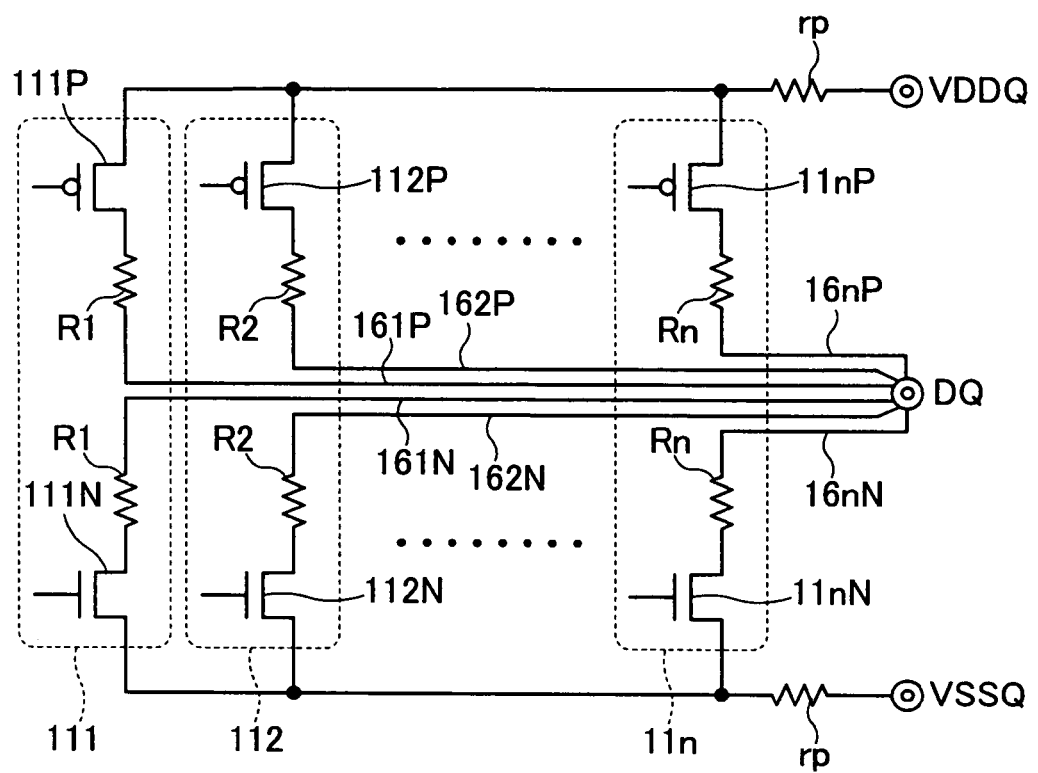
FIG. 14 is an equivalent circuit diagram of the unit buffers according to the second embodiment.

FIG. 14 is an equivalent circuit diagram of the unit buffers 111 to 11$n$ according to the second embodiment.

As shown in FIG. 14, the unit buffers 111 to 11$n$ are connected between the power source terminal VDDQ and the power source terminal VSSQ. However, on a chip, there is a certain distance between the power source terminal VDDQ and the unit buffers 111 to 11$n$ and between the power source terminal VSSQ and the unit buffers 111 to 11$n$. Therefore, a parasitic resistance component $r_p$ is present between these power source terminals and the unit buffers. Although a certain resistance component is also present between the unit buffers, this resistance component can be substantially disregarded because the unit buffers 111 to 11$n$ are collectively arranged at one position on the chip, that is, near the data I/O terminal DQ, as shown in FIG. 4.

In the second embodiment, resistance values of resistors R1 to Rn included in the unit buffers 111 to 11$n$, respectively are set at R1>R2> ... >Rn. A resistance value of the resistor R1 is set at substantially the same as the ON resistance $r_{mos}$ of the parallel circuit, and resistance values of other resistors R2 to Rn are set at values slightly lower than the resistance value of the resistor R1.

Specifically, a value of Rj−R(j+1) (j is an integer of 1 to n−1) is preferably larger than a power resistance $r_p$, and is particularly preferably about two times of the power resistance $r_p$. That is, the resistances are preferably set at R1≅R2+ 2$r_p$≅R3+4$r_p$≅ ... ≅Rn+2$r_p$(n−1). Accordingly, a variance of an impedance generated when the unit buffers 111 to 11$n$ are operated in parallel can be offset.

Specifically, when X=24Ω, only the unit buffer 111 is operated when an output impedance is set at 240Ω (i=1). In this case, an impedance of the unit buffer 111 accurately becomes 240Ω including the power source resistance $r_p$.

When an output impedance is set at 120Ω (i=2), the unit buffers 111 and 112 are operated simultaneously. As described above, the resistance R2 included in the unit buffer 112 is lower than the resistance R1 included in the unit buffer 111, and is preferably R2≅R1−2$r_p$. Therefore, when the power source resistance $r_p$ is 1.4Ω, an impedance of the unit buffer 112 becomes 235.8Ω. In this case, an output impedance including the power source resistance $r_p$ becomes substantially 120Ω, and substantially matches a target value X/2.

Furthermore, when an output impedance is set at 80Ω (i=3), the unit buffers 111 to 113 are operated simultaneously. The resistance R3 included in the unit buffer 113 is lower than the resistance R2 included in the unit buffer 112, and is preferably R3≅R2−2$r_p$. Therefore, when the power source resistance $r_p$ is 1.4Ω, an impedance of the unit buffer 113 becomes 233Ω. In this case, an output impedance including the power source resistance $r_p$ becomes substantially 80Ω, and substantially matches a target value X/3.

Similarly, when an output impedance is set at X/i, i unit buffers 111 to 11i are used in parallel. Accordingly, an output impedance including the power source resistance $r_p$ can be substantially matched with a target value X/i.

As explained above, in the second embodiment, differences are provided in resistance values of the resistances R1 to Rn included in the unit buffers 111 to 11$n$, by taking the power source resistance $r_p$ into consideration. Therefore, an output impedance including the power source resistance $r_p$ can be substantially matched with the target value (X/i).

A third embodiment of the present invention is explained next.

In the third embodiment, deviation of impedances due to a parasitic resistance between the power source terminals VDDQ and VSSQ and the unit buffers 111 to 11$n$ are offset by a method different from that according to the second embodiment. Other features of the third embodiment are identical to those of the first embodiment, and the third embodiment can achieve effects identical to those of the first embodiment.

Figure 15:
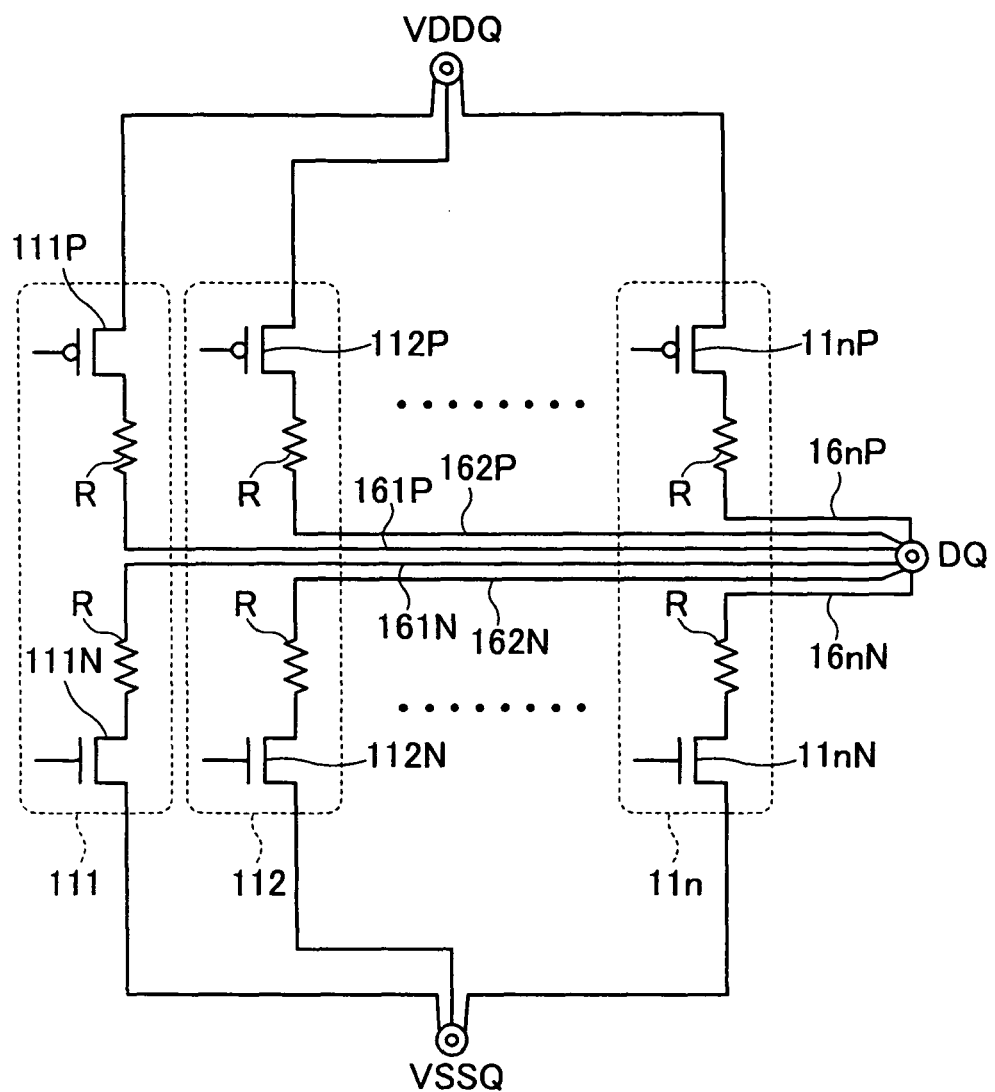
FIG. 15 is an equivalent circuit diagram of the unit buffers according to the third embodiment.

FIG. 15 is an equivalent circuit diagram of the unit buffers 111 to 11$n$ according to the third embodiment.

As shown in FIG. 15, in the third embodiment, the unit buffers 111 to 11$n$ are connected to the power source terminals VDDQ and VSSQ without via a common power-source wiring part. Based on this configuration, the power source resistance $r_p$ shown in FIG. 14 is individually given to the unit buffers 111 to 11$n$. Accordingly, a deviation of impedances due to a parasitic resistance between the power source terminals VDDQ and VSSQ and the unit buffers 111 to 11$n$ does not occur. This is based on the same principle as a principle that a deviation of impedances is decreased by individually connecting the unit buffers 111 to 11$n$ and the data I/O terminal DQ.

It is not necessary that there is no common power-source wiring part between the unit buffers 111 to 11n and the power source terminals VDDQ and VSSQ. Even when there exists a common power-source wiring part shared by two or more unit buffers in an output wiring path that connects many unit buffers and the power source terminals VDDQ and VSSQ, deviation of impedances due to the common power-source wiring part can be sufficiently suppressed more than deviation of impedances in conventional technique, if a parasitic resistance of the common power-source wiring part is sufficiently lower than a resistance value of an individual power-source wiring part individually connected to a corresponding unit buffer.

A fourth embodiment of the present invention is explained next.

Figure 16:
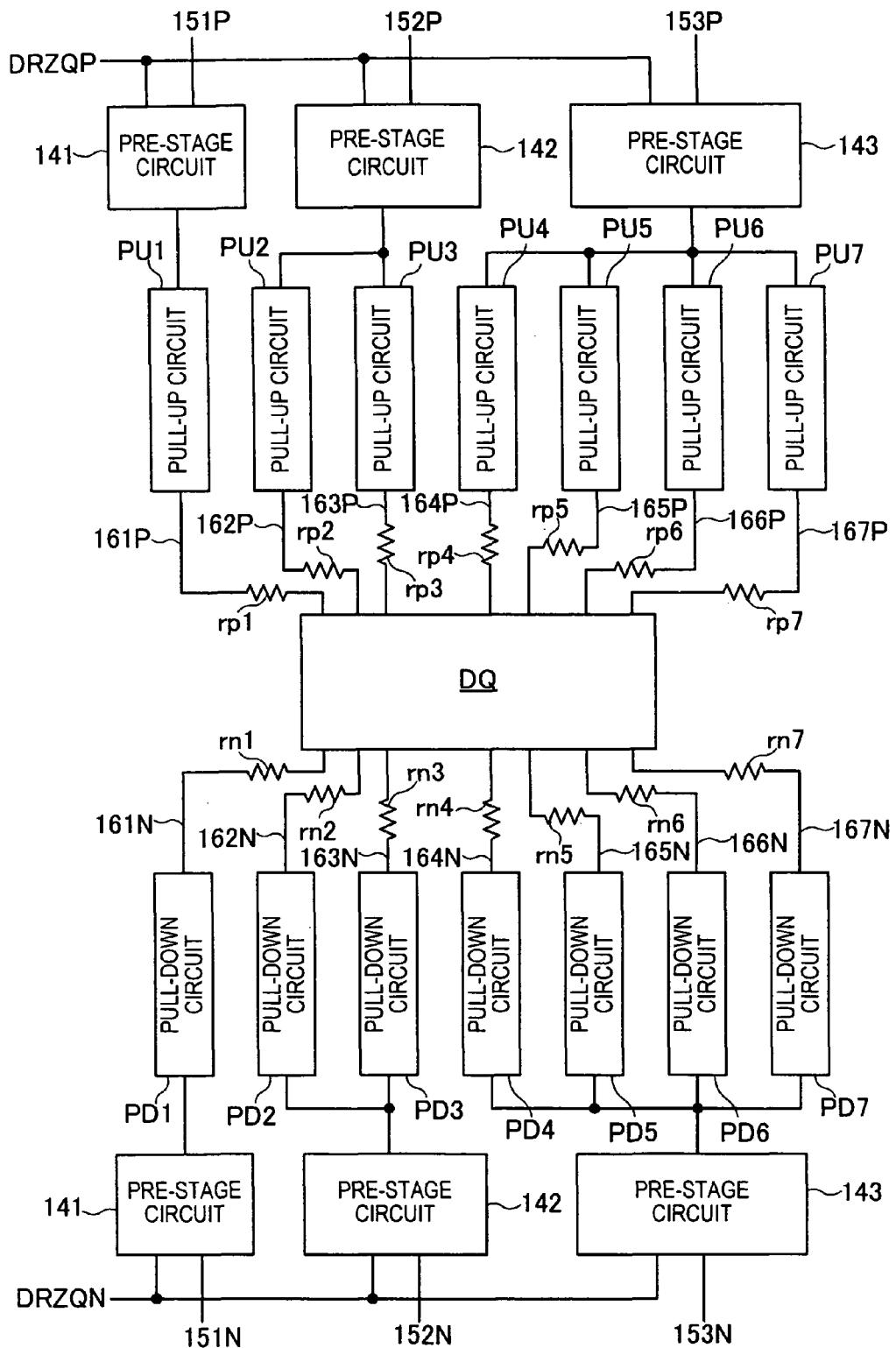
FIG. 16 is a block diagram according to a fourth embodiment of the present invention.

As shown in FIG. 16, in the fourth embodiment, seven unit buffers 111 to 117 are provided (n=7). A pre-stage circuit is not allocated to each of the unit buffers 111 to 117, but many unit buffers are grouped, and a pre-stage circuit is allocated in a group unit.

Specifically, the pre-stage circuit 141 is allocated to the unit buffer 111, the pre-stage circuit 142 is allocated in common to the unit buffers 112 and 113, and the pre-stage circuit 143 is allocated in common to the unit buffers 114 to 117. Therefore, when the output control circuit 150 selects the pre-stage circuit 142, two unit buffers 112 and 113 are activated simultaneously. When the output control circuit 150 selects the pre-stage circuit 143, four unit buffers 114 to 117 are activated simultaneously. Accordingly, the number of pre-stage circuits can be decreased, and consequently, a circuit scale can be decreased and power consumption can be decreased.

Each group includes $2^n$ (n is a natural number) unit buffers. Because the number of unit buffers included in each group is different from each other, an arbitrary number from one to seven can be selected as the number of unit buffers to be activated.

A fifth embodiment of the present invention is explained next.

Figure 17:
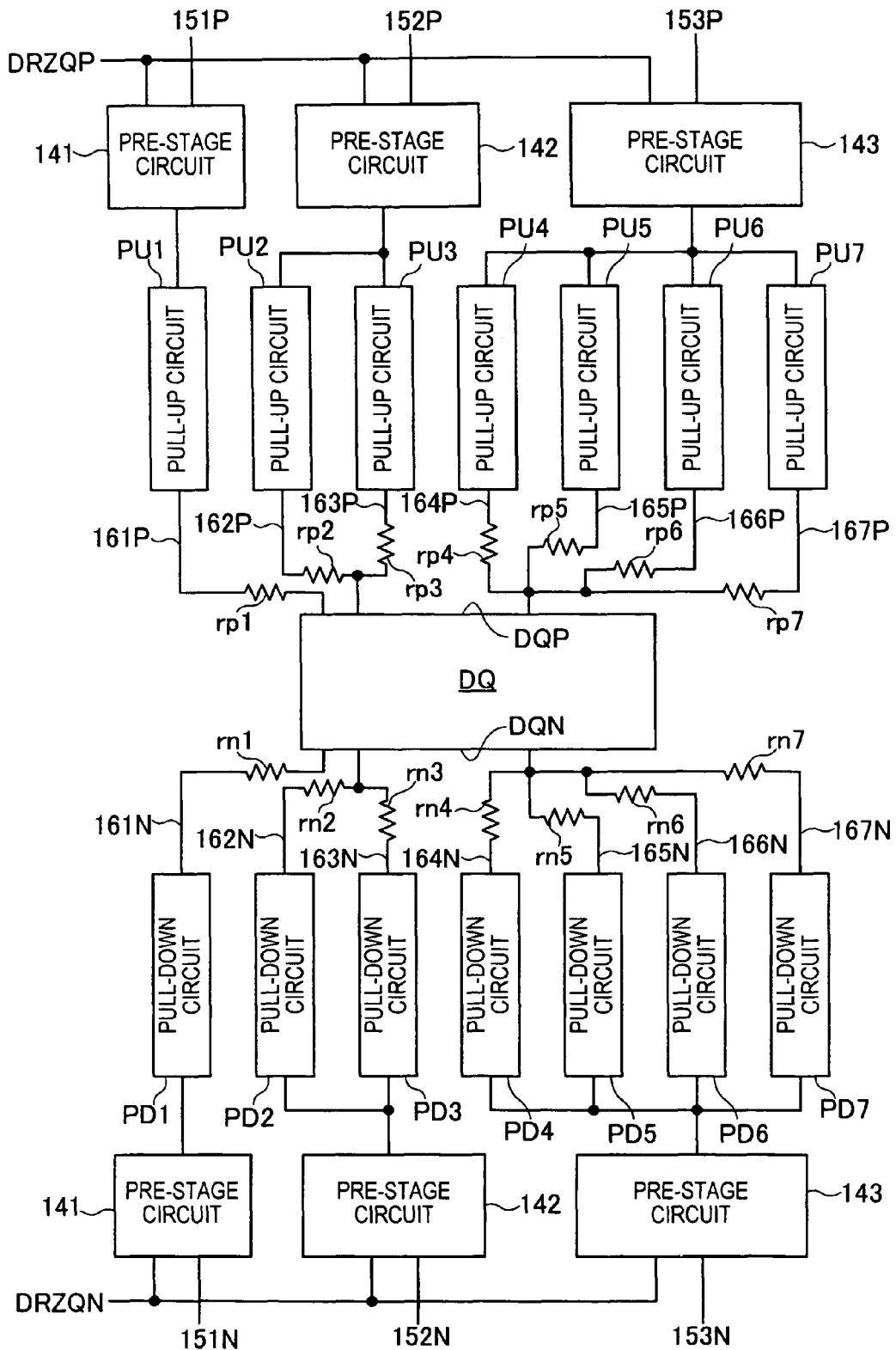
FIG. 17 is a block diagram according to a fifth embodiment of the present invention.

As shown in FIG. 17, in the fifth embodiment, unit buffers belonging to the same group are connected to the data I/O terminal DQ via a common power-source wiring part. In this configuration, a parasitic resistance component of an output wiring path per one unit buffer is different between groups. However, unit buffers belonging to the same group are not individually activated, but unit buffers belonging to each group are always activated simultaneously. Therefore, differences of parasitic resistance components can be offset by differentiating resistance values included in unit buffers for each group.

Specifically, a lower resistance value is set in a resistor within a unit buffer belonging to a group having a relatively large number of unit buffers than a resistance value in a resistor within a unit buffer belonging to a group having a relatively small number of unit buffers. That is, resistance values are designed at r1>r2>r3, where r1 is a resistance value of the resistor R included in the unit buffer 111, r2 is a resistance value of the resistor R included in the unit buffers 112 and 113, and r3 is a resistance value of the resistor R included in the unit buffers 114 to 117. A difference between r1 and r3 is determined by a parasitic resistance of a common output wiring part.

As explained above, according to the fifth embodiment, a wiring track can be more effectively used in addition to obtaining an effect of the fourth embodiment because plural output wirings are shared by a common output wiring part. Because the differences of impedances due to the common output wiring part are offset by resistors, deviation of impedances does not substantially occur as a result.

It is apparent that the present invention is not limited to the above embodiments, but may be modified and changed without departing from the scope and spirit of the invention.

For example, while the above embodiments have described a case that the present invention is applied to a DDR SDRAM, the application target of the present invention is not limited thereto.

In the fourth and fifth embodiments, two unit buffers 112 and 113 constitute independent circuits, respectively, and four unit buffers 114 to 117 similarly constitute independent circuits, respectively. However, it is not essential that these are completely independent circuits. As far as individual unit buffers can be regarded as the same as a replica buffer, these circuits can be internally connected to each other as shown in FIG. 18.

Figure 18:
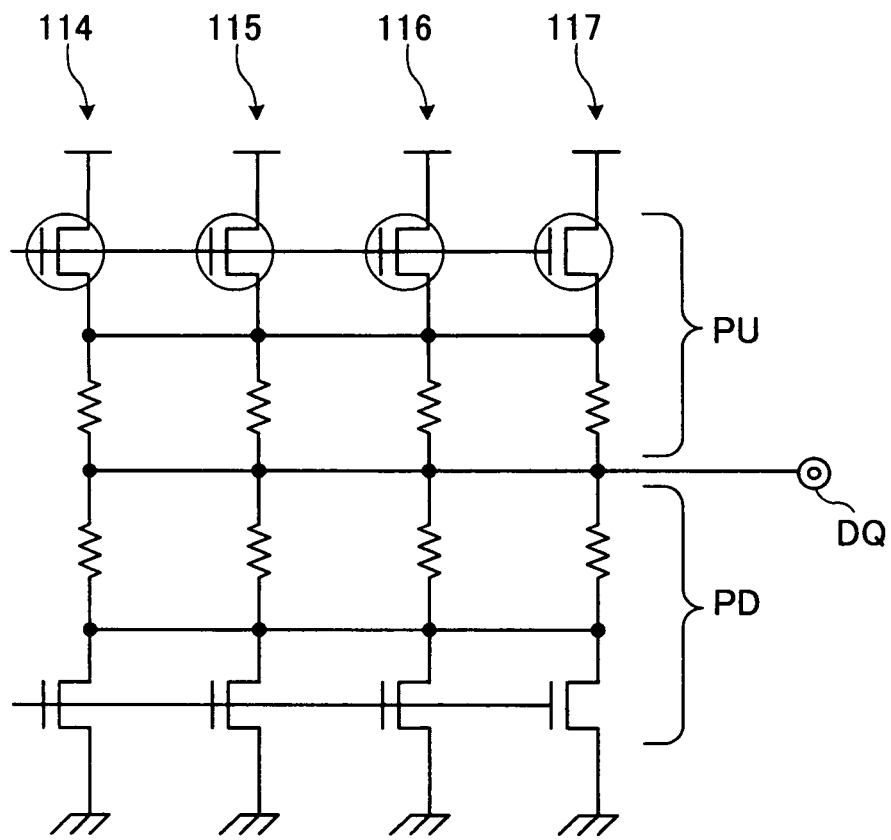
FIG. 18 is a circuit diagram in which the unit buffers are connected with each other internally.

FIG. 18 is an example that the four unit buffers 114 to 117 are internally connected to each other. In this example, contacts between P-channel MOS transistors included in the pull-up circuit PU and resistors are connected to each other, and contacts between N-channel MOS transistors included in the pull-down circuit PD and resistors are connected to each other. Even in this case, unit buffers 114 to 117 can be regarded as the same as a replica buffer, and therefore, in the present invention, "parallel connection of unit buffers" also includes this case.

Figure 19A:
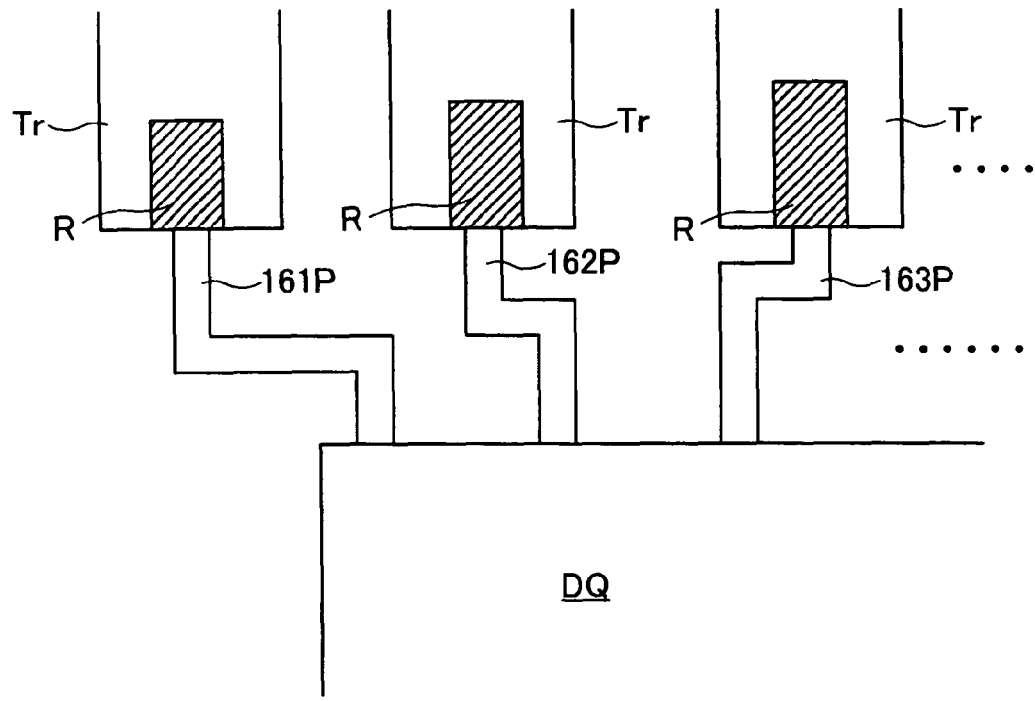
FIG. 19A is a schematic diagram of position of resistance R as one example.
Figure 19B:
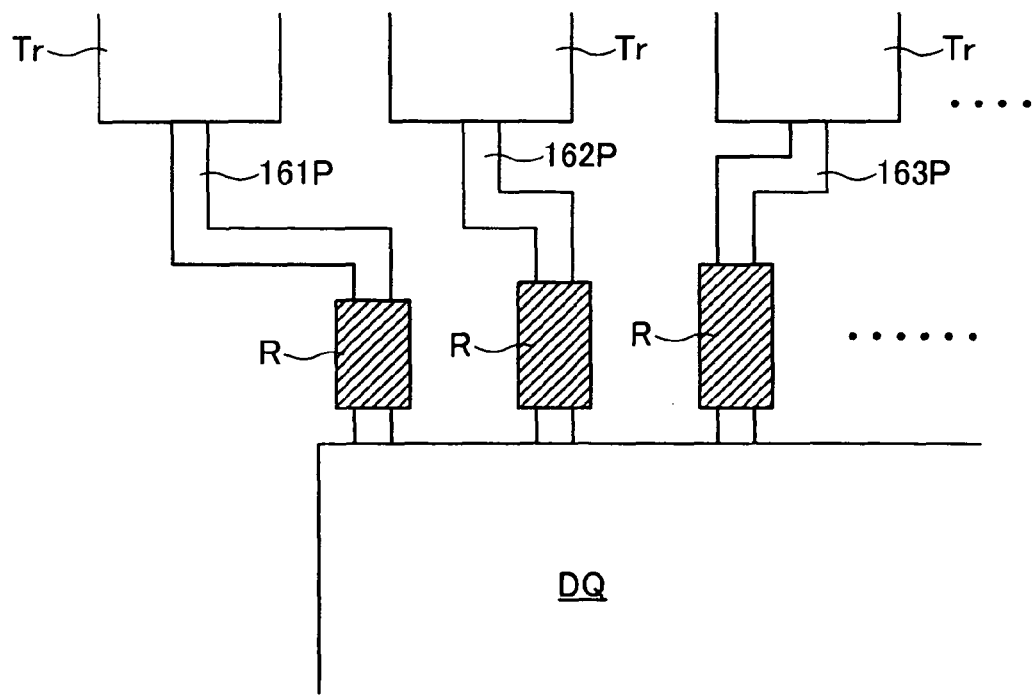
FIG. 19B is a schematic diagram of position of resistance R as another example.

Further, formation positions of the resistors R included in the unit buffers 111 to 11n are not particularly limited as far as the formation positions are between a parallel circuit configured by output transistors and the data I/O terminal DQ. Therefore, resistors can be arranged near transistor regions Tr in which parallel circuits of output transistors are formed as shown in FIG. 19A, or can be arranged near the data I/O terminal DQ as shown in FIG. 19B. Furthermore, as shown in FIGS. 19A and 19B, resistance values of unit buffers can be more accurately matched by setting a short length to each resistor R when an individual output wiring unit is longer, that is, when a wiring resistance of the individual output wiring unit is larger.

What is claimed is:
1. A semiconductor device comprising:
a bonding pad including a first portion and a second portion arranged separately from the first portion in physical layout;
first and second transistors configured to receive a control signal in common and output first and second output data in response to the control signal, respectively;
first and second terminals configured to be supplied with the first and second output data, respectively, the first terminal being arranged separately from the second terminal in physical layout;
a first wiring coupled between the first terminal and the first portion of the bonding pad in physical layout;
a second wiring coupled between the second terminal and the second portion of the bonding pad, the second wiring being arranged separately from the first wiring in physical layout; and
a third wiring conveying the control signal, the first transistor including a gate electrode that is directly connected to the third wiring and the second transistor including a gate electrode that is directly connected to the third wiring.
2. The semiconductor device as claimed in claim 1, wherein the bonding pad is substantially rectangular in shape.

3. The semiconductor device as claimed in claim 1, further comprising:
- a third transistor receiving the control signal, outputting third output data in response to the control signal; and
- a fourth wiring coupled between the third transistor and the bonding pad to transfer the third output data to the bonding pad, the fourth wiring being separated from the first wiring such that the first wiring does not have any common node with the fourth wiring, the fourth wiring being connected to the second wiring such that the second and fourth wirings have a common node.

4. The semiconductor device as claimed in claim 1, wherein each of the first and second transistors comprises a first conductive type transistor, the semiconductor device further comprising:
- third and fourth transistors receiving an additional control signal in common, outputting third and fourth output data in response to the additional control signal, respectively, each of the third and fourth transistors comprising a second conductive type transistor; and
- fourth and fifth wirings coupled between the third and fourth transistors and the bonding pad to transfer the third and fourth output data to the bonding pad, respectively, the fourth and fifth wirings being separated from each other such that the fourth wiring does not have any common node with the fifth wiring.

5. The semiconductor device as claimed in claim 1, wherein the first and second wirings include first and second resistor portions, respectively.

6. A semiconductor device comprising:
- a bonding pad including a first portion and a second portion arranged separately from the first portion in physical layout;
- first and second transistors configured to receive a control signal in common and output first and second output data in response to the control signal, respectively, wherein each of the first and second transistors comprises a first conductive type transistor;
- first and second terminals configured to be supplied with the first and second output data, respectively, the first terminal being arranged separately from the second terminal in physical layout;
- a first wiring coupled between the first terminal and the first portion of the bonding pad in physical layout;
- a second wiring coupled between the second terminal and the second portion of the bonding pad, the second wiring being arranged separately from the first wiring in physical layout;
- third and fourth transistors receiving an additional control signal in common, outputting third and fourth output data in response to the additional control signal, respectively, each of the third and fourth transistors comprising a second conductive type transistor;
- third and fourth wirings coupled between the third and fourth transistors and the bonding pad to transfer the third and fourth output data to the bonding pad, respectively, the third and fourth wirings being separated from each other such that the third wiring does not have any common node with the fourth wiring;
- a fifth transistor receiving the control signal, outputting fifth output data in response to the control signal, comprising the first conductive type transistor;
- a sixth transistor receiving the additional control signal, outputting sixth output data in response to the additional control signal, comprising the second conductive type transistor;
- a fifth wiring coupled between the fifth transistor and the bonding pad to transfer the fifth output data to the bonding pad, the fifth wiring being separated from the first wiring such that the first wiring does not have any common node with the fifth wiring, the fifth wiring being connected to the second wiring such that the fifth and second wirings have a first common node; and
- a sixth wiring coupled between the sixth transistor and the bonding pad to transfer the sixth output data to the bonding pad, the sixth wiring being separated from the third wiring such that the third wiring does not have any common node with the sixth wiring, the sixth wiring being connected to the fourth wiring such that the sixth and fourth wirings have a second common node.

7. A semiconductor device comprising:
- a bonding pad having a substantially rectangular shape;
- a first wiring extending from a first portion of the bonding pad;
- a second wiring extending independently of the first wiring from a second portion of the bonding pad that is different and apart from the first portion;
- a third wiring configured to be supplied with a first voltage;
- a first transistor coupled between the first and third wirings;
- a second transistor coupled between the second and third wirings; and
- a fourth wiring conveying a control signal,
- the first transistor including a gate electrode that is directly connected to the fourth wiring to be supplied with the control signal, the second transistor including a gate electrode that is directly connected to the fourth wiring to be supplied with the control signal in common to the gate electrode of the first transistor.

8. The semiconductor device as claimed in claim 7, further comprising a first resistor coupled between the first wiring and the first transistor and a second resistor coupled between the second wiring and the second transistor.

9. The semiconductor device as claimed in claim 7, wherein the first and second transistors are same conductivity type as each other.

10. The semiconductor device as claimed in claim 7, further comprising:
- a fifth wiring extending independently of the first and second wirings from a third portion of the bonding pad that is different and apart from the first and second portions; and
- a third transistor coupled between the fifth and third wirings and configured to receive the control signal at a gate electrode thereof in common with the first and second transistors.

11. The semiconductor device as claimed in claim 10, wherein the first, second and third transistors are same conductivity type as each other.

12. The semiconductor device as claimed in claim 7, further comprising:
- a fifth wiring extending independently of the first and second wirings from a third portion that is different and apart from the first and second portions of the bonding pad;
- a sixth wiring extending independently of the first, second and fifth wirings from a fourth portion of the bonding pad that is different and apart from the first, second and third portions;
- a seventh wiring configured to be supplied with a second voltage that is different from the first voltage;
- a third transistor coupled between the fifth and seventh wirings; and a fourth transistor coupled between the sixth and seventh wirings;

the third and fourth transistors being configured to receive an additional control signal in common at gate electrodes thereof.

13. The semiconductor device as claimed in claim 12, wherein the first and second transistors are first conductivity type and the third and fourth transistors are second conductivity type different from the first conductivity type.

14. The semiconductor device as claimed in claim 12, further comprising a first resistor coupled between the first wiring and the first transistor, a second resistor coupled between the second wiring and the second transistor, a third resistor coupled between the fifth wiring and the third transistor and a fourth resistor coupled between the sixth wiring and the fourth transistor.

15. The semiconductor device as claimed in claim 12, further comprising:

an eighth wiring extending independently of the first, second, fifth and sixth wirings from a fifth portion that is different and apart from the first, second, third and fourth portions of the bonding pad;

a ninth wiring extending independently of the first, second, fifth, sixth, and eighth wirings from a sixth portion that is different and apart from the first, second, third, fourth and fifth portions of the bonding pad;

a fifth transistor coupled between the eighth and third wirings and configured to receive the control signal at a gate electrode thereof in common with the first and second transistors; and a sixth transistor coupled between the ninth and seventh wirings and configured to receive the additional control signal at a gate electrode thereof in common with the third and fourth transistors.

16. The semiconductor device as claimed in claim 15, wherein the first, second and fifth transistors are first conductivity type and the third, fourth and sixth transistors are second conductivity type different from the first conductivity type.

17. The semiconductor device as claimed in claim 15, further comprising a first resistor coupled between the first wiring and the first transistor, a second resistor coupled between the second wiring and the second transistor, a third resistor coupled between the fifth wiring and the third transistor, a fourth resistor coupled between the sixth wiring and the fourth transistor, a fifth resistor coupled between the eighth wiring and the fifth transistor and a sixth resistor coupled between the ninth wiring and the sixth transistor.

* * * * *